(12) United States Patent
Brueck et al.

(10) Patent No.: US 11,349,011 B2
(45) Date of Patent: May 31, 2022

(54) METHOD OF MAKING HETEROEPITAXIAL STRUCTURES AND DEVICE FORMED BY THE METHOD

(71) Applicant: UNM RAINFOREST INNOVATIONS, Albuquerque, NM (US)

(72) Inventors: Steven R. J. Brueck, Albuquerque, NM (US); Stephen D. Hersee, Albuquerque, NM (US); Seung-Chang Lee, Albuquerque, NM (US); Daniel Feezell, Albuquerque, NM (US)

(*) Notice: Subject to any disclaimer, the term of this patent is extended or adjusted under 35 U.S.C. 154(b) by 0 days.

(21) Appl. No.: 16/748,361

(22) Filed: Jan. 21, 2020

(65) Prior Publication Data

US 2020/0161449 A1 May 21, 2020

Related U.S. Application Data

(60) Continuation of application No. 16/162,787, filed on Oct. 17, 2018, which is a continuation of application
(Continued)

(51) Int. Cl.
*H01L 29/66* (2006.01)
*H01L 21/02* (2006.01)
(Continued)

(52) U.S. Cl.
CPC ........ *H01L 29/66462* (2013.01); *B82Y 10/00* (2013.01); *B82Y 40/00* (2013.01);
(Continued)

(58) Field of Classification Search
CPC ......... H01L 29/66462; H01L 21/02107; H01L 21/02381; H01L 21/02532;
(Continued)

(56) References Cited

U.S. PATENT DOCUMENTS 688,555 A 12/1901 Specht
3,958,040 A 5/1976 Webb et al.
(Continued)

FOREIGN PATENT DOCUMENTS

EP 1555688 B1 11/2009
JP 6235267 B2 7/1987
(Continued)

OTHER PUBLICATIONS

Sze, VLSI Technology, Second Edition, 1988, AT&T Bell Laboratories, Murray Hill, NJ, USA.
(Continued)

*Primary Examiner* — Peter Bradford
(74) *Attorney, Agent, or Firm* — MH2 Technology Law Group LLP

(57) ABSTRACT

A method for making a heteroepitaxial layer. The method comprises providing a semiconductor substrate. A seed area delineated with a selective growth mask is formed on the semiconductor substrate. The seed area comprises a first material and has a linear surface dimension of less than 100 nm. A heteroepitaxial layer is grown on the seed area, the heteroepitaxial layer comprising a second material that is different from the first material. Devices made by the method are also disclosed.

25 Claims, 11 Drawing Sheets

Related U.S. Application Data

No. 14/830,241, filed on Aug. 19, 2015, now Pat. No. 10,141,418, which is a division of application No. 13/944,808, filed on Jul. 17, 2013, now Pat. No. 9,142,400.

(60) Provisional application No. 61/672,713, filed on Jul. 17, 2012.

(51) Int. Cl.
| | |
|---|---|
| H01L 29/06 | (2006.01) |
| B82Y 40/00 | (2011.01) |
| H01L 29/778 | (2006.01) |
| B82Y 10/00 | (2011.01) |
| H01L 29/775 | (2006.01) |
| H01L 29/78 | (2006.01) |
| H01L 29/04 | (2006.01) |
| H01L 29/16 | (2006.01) |
| H01L 29/20 | (2006.01) |
| H01L 27/12 | (2006.01) |

(52) U.S. Cl.
CPC .. *H01L 21/02107* (2013.01); *H01L 21/02381* (2013.01); *H01L 21/02532* (2013.01); *H01L 21/02538* (2013.01); *H01L 21/02639* (2013.01); *H01L 29/04* (2013.01); *H01L 29/0665* (2013.01); *H01L 29/0673* (2013.01); *H01L 29/0676* (2013.01); *H01L 29/16* (2013.01); *H01L 29/20* (2013.01); *H01L 29/66469* (2013.01); *H01L 29/66666* (2013.01); *H01L 29/66795* (2013.01); *H01L 29/775* (2013.01); *H01L 29/7783* (2013.01); *H01L 29/785* (2013.01); *H01L 29/7827* (2013.01); *H01L 29/7851* (2013.01); *H01L 27/1211* (2013.01); *H01L 29/045* (2013.01)

(58) Field of Classification Search
CPC ......... H01L 21/02538; H01L 21/02639; H01L 29/04; H01L 29/0665; H01L 29/0673; H01L 29/0676; H01L 29/16; H01L 29/20; H01L 29/66469; H01L 29/66666; H01L 29/66795; H01L 29/775; H01L 29/7783; H01L 29/7827; H01L 29/785; H01L 29/7851; H01L 27/1211; H01L 29/045; B82Y 10/00; B82Y 40/00

See application file for complete search history.

(56) References Cited

U.S. PATENT DOCUMENTS

| | | | |
|---|---|---|---|
| 4,222,792 A | 9/1980 | Lever et al. |
| 4,551,394 A | 11/1985 | Betsch et al. |
| 4,571,819 A | 2/1986 | Rogers et al. |
| 4,651,179 A | 3/1987 | Reichert |
| 4,876,210 A | 10/1989 | Barnett et al. |
| 5,098,850 A | 3/1992 | Nishida et al. |
| 5,166,767 A | 11/1992 | Kapoor et al. |
| 5,229,316 A | 7/1993 | Lee et al. |
| 5,236,546 A | 8/1993 | Mizutani |
| 5,269,852 A | 12/1993 | Nishida |
| 5,403,751 A | 4/1995 | Nishida et al. |
| 5,417,180 A | 5/1995 | Nakamura |
| 5,432,120 A | 7/1995 | Meister et al. |
| 5,451,538 A | 9/1995 | Fitch et al. |
| 5,453,395 A | 9/1995 | Lur |
| 5,510,645 A | 4/1996 | Fitch et al. |
| 5,661,313 A | 8/1997 | Dubbelday et al. |
| 5,702,977 A | 12/1997 | Jang et al. |
| 5,854,126 A | 12/1998 | Tobben et al. |
| 5,880,007 A | 3/1999 | Varian et al. |
| 6,037,237 A | 3/2000 | Park et al. |
| 6,039,803 A | 3/2000 | Fitzgerald et al. |
| 6,048,775 A | 4/2000 | Yao et al. |
| 6,049,650 A | 4/2000 | Erman et al. |
| 6,057,207 A | 5/2000 | Lin et al. |
| 6,136,727 A | 10/2000 | Ueno |
| 6,228,691 B1 | 5/2001 | Doyle |
| 6,270,353 B1 | 8/2001 | Andrews et al. |
| 6,277,706 B1 | 8/2001 | Ishikawa |
| 6,291,296 B1 | 9/2001 | Hui et al. |
| 6,362,071 B1 | 3/2002 | Nguyen et al. |
| 6,387,764 B1 | 5/2002 | Curtis et al. |
| 6,413,802 B1 | 7/2002 | Hu et al. |
| 6,482,715 B2 | 11/2002 | Park et al. |
| 6,486,042 B2 | 11/2002 | Gehrke et al. |
| 6,511,888 B1 | 1/2003 | Park et al. |
| 6,541,349 B2 | 4/2003 | Arthanari et al. |
| 6,555,845 B2 | 4/2003 | Sunakawa et al. |
| 6,642,090 B1 | 11/2003 | Fried et al. |
| 6,645,866 B2 | 11/2003 | Park et al. |
| 6,753,555 B2 | 6/2004 | Takagi et al. |
| 6,762,483 B1 | 7/2004 | Krivokapic et al. |
| 6,794,718 B2 | 9/2004 | Nowak et al. |
| 6,803,602 B2 | 10/2004 | Kong et al. |
| 6,806,115 B2 | 10/2004 | Koide et al. |
| 6,809,351 B2 | 10/2004 | Kuramoto et al. |
| 6,812,119 B1 | 11/2004 | Ahmed et al. |
| 6,815,241 B2 | 11/2004 | Wang |
| 6,828,646 B2 | 12/2004 | Marty et al. |
| 6,835,618 B1 | 12/2004 | Dakshina-Murthy et al. |
| 6,838,322 B2 | 1/2005 | Pham et al. |
| 6,855,990 B2 | 2/2005 | Yeo et al. |
| 6,858,478 B2 | 2/2005 | Chau et al. |
| 6,873,009 B2 | 3/2005 | Hisamoto et al. |
| 6,881,651 B2 | 4/2005 | Koide et al. |
| 6,885,055 B2 | 4/2005 | Lee |
| 6,919,258 B2 | 7/2005 | Grant et al. |
| 6,921,673 B2 | 7/2005 | Kobayashi et al. |
| 6,955,977 B2 | 10/2005 | Kong et al. |
| 6,958,254 B2 | 10/2005 | Seifert |
| 6,977,194 B2 | 12/2005 | Belyansky et al. |
| 6,982,435 B2 | 1/2006 | Shibata et al. |
| 6,994,751 B2 | 2/2006 | Hata et al. |
| 7,002,207 B2 | 2/2006 | Kim et al. |
| 7,012,314 B2 | 3/2006 | Bude et al. |
| 7,015,517 B2 | 3/2006 | Grant et al. |
| 7,038,289 B2 | 5/2006 | Marty et al. |
| 7,045,401 B2 | 5/2006 | Lee et al. |
| 7,071,048 B2 | 7/2006 | Son et al. |
| 7,074,662 B2 | 7/2006 | Lee et al. |
| 7,118,987 B2 | 10/2006 | Fu et al. |
| 7,128,846 B2 | 10/2006 | Nishijima et al. |
| 7,141,506 B2 | 11/2006 | Endoh et al. |
| 7,148,541 B2 | 12/2006 | Park et al. |
| 7,154,118 B2 | 12/2006 | Lindert et al. |
| 7,176,067 B2 | 2/2007 | Jung et al. |
| 7,176,115 B2 | 2/2007 | Kitaoka et al. |
| 7,176,549 B2 | 2/2007 | Schuegraf et al. |
| 7,196,374 B1 | 3/2007 | Lin et al. |
| 7,198,995 B2 | 4/2007 | Chidambarrao et al. |
| 7,205,201 B2 | 4/2007 | Huang et al. |
| 7,205,210 B2 | 4/2007 | Barr et al. |
| 7,220,658 B2 | 5/2007 | Haskell et al. |
| 7,226,504 B2 | 6/2007 | Maa et al. |
| 7,229,901 B2 | 6/2007 | Savage et al. |
| 7,238,586 B2 | 7/2007 | Hsu et al. |
| 7,247,534 B2 | 7/2007 | Chidambarrao et al. |
| 7,268,058 B2 | 9/2007 | Chau et al. |
| 7,285,820 B2 | 10/2007 | Park et al. |
| 7,301,199 B2 | 11/2007 | Lieber et al. |
| 7,309,626 B2 | 12/2007 | Ieong et al. |
| 7,317,230 B2 | 1/2008 | Lee et al. |
| 7,323,375 B2 | 1/2008 | Yoon et al. |
| 7,326,608 B2 | 2/2008 | Lee et al. |
| 7,385,237 B2 | 6/2008 | Lee et al. |
| 7,385,247 B2 | 6/2008 | Rhee et al. |
| 7,411,241 B2 | 8/2008 | Kim et al. |
| 7,488,385 B2 | 2/2009 | Lahreche et al. |
| 7,504,323 B2 | 3/2009 | Motoki et al. |

(56) References Cited

U.S. PATENT DOCUMENTS

| | | |
|---|---|---|
| 7,507,628 B2 | 3/2009 | Hong et al. |
| 7,514,328 B2 | 4/2009 | Rao |
| 7,514,366 B2 | 4/2009 | Trivedi et al. |
| 7,514,739 B2 | 4/2009 | Park et al. |
| 7,521,274 B2 | 4/2009 | Hersee et al. |
| 7,525,160 B2 | 4/2009 | Kavalieros et al. |
| 7,535,061 B2 | 5/2009 | Lee et al. |
| 7,547,610 B2 | 6/2009 | Schwan et al. |
| 7,554,165 B2 | 6/2009 | Hokazono |
| 7,582,516 B2 | 9/2009 | Dyer et al. |
| 7,626,246 B2 | 12/2009 | Lochtefeld et al. |
| 7,667,271 B2 | 2/2010 | Yu et al. |
| 7,671,420 B2 | 3/2010 | Shin et al. |
| 7,777,250 B2 | 8/2010 | Lochtefeld |
| 7,785,706 B2 | 8/2010 | Schroeder et al. |
| 7,791,108 B2 | 9/2010 | Hurkx et al. |
| 7,799,592 B2 | 9/2010 | Lochtefeld |
| 7,807,523 B2 | 10/2010 | Liu et al. |
| 7,842,566 B2 | 11/2010 | Lee et al. |
| 7,851,790 B2 | 12/2010 | Rachmady et al. |
| 7,863,122 B2 | 1/2011 | Booth et al. |
| 7,875,925 B2 | 1/2011 | Ino |
| 7,875,958 B2 | 1/2011 | Cheng et al. |
| 7,888,201 B2 | 2/2011 | Yeo et al. |
| 7,892,956 B2 | 2/2011 | Deligianni et al. |
| 7,893,506 B2 | 2/2011 | Chau et al. |
| 7,901,968 B2 | 3/2011 | Weeks et al. |
| 7,906,814 B2 | 3/2011 | Lee |
| 7,910,492 B2 | 3/2011 | Samuelson et al. |
| 7,915,642 B2 | 3/2011 | Pillarisetty et al. |
| 7,939,862 B2 | 5/2011 | Moroz et al. |
| 7,939,889 B2 | 5/2011 | Yu et al. |
| 7,977,706 B2 | 7/2011 | Lochtefeld |
| 7,994,028 B2 | 8/2011 | Barwicz et al. |
| 7,995,892 B2 | 8/2011 | Bond et al. |
| 8,035,153 B2 | 10/2011 | Fang et al. |
| 8,062,951 B2 | 11/2011 | Chen et al. |
| 8,062,963 B1 | 11/2011 | Van Dal |
| 8,063,450 B2 | 11/2011 | Wernersson et al. |
| 8,072,012 B2 | 12/2011 | Verhulst et al. |
| 8,080,468 B2 | 12/2011 | Scherer et al. |
| 8,101,473 B2 | 1/2012 | Cho et al. |
| 8,120,060 B2 | 2/2012 | Fitzgerald |
| 8,129,763 B2 | 3/2012 | Bjoerk et al. |
| 8,129,769 B2 | 3/2012 | Kadoya |
| 8,133,797 B2 | 3/2012 | Van Schravendijk et al. |
| 8,134,142 B2 | 3/2012 | Hurkx et al. |
| 8,169,024 B2 | 5/2012 | Cheng et al. |
| 8,169,025 B2 | 5/2012 | Bedell et al. |
| 8,173,551 B2 | 5/2012 | Bai et al. |
| 8,183,587 B2 | 5/2012 | Samuelson et al. |
| 8,183,667 B2 | 5/2012 | Park |
| 8,188,513 B2 | 5/2012 | Hersee et al. |
| 8,212,336 B2 | 7/2012 | Goebel et al. |
| 8,236,634 B1 | 8/2012 | Kanike et al. |
| 8,247,275 B2 | 8/2012 | Hoentschel et al. |
| 8,263,462 B2 | 9/2012 | Hung et al. |
| 8,264,021 B2 | 9/2012 | Lai et al. |
| 8,264,032 B2 | 9/2012 | Yeh et al. |
| 8,274,097 B2 | 9/2012 | Cheng |
| 8,288,756 B2 | 10/2012 | Adhikari et al. |
| 8,304,817 B2 | 11/2012 | Tezuka et al. |
| 8,310,013 B2 | 11/2012 | Lin et al. |
| 8,313,999 B2 | 11/2012 | Cappellani et al. |
| 8,324,660 B2 | 12/2012 | Lochtefeld et al. |
| 8,330,143 B2 | 12/2012 | Wernersson et al. |
| 8,344,242 B2 | 1/2013 | Fiorenza et al. |
| 8,362,568 B2 | 1/2013 | Lin et al. |
| 8,362,572 B2 | 1/2013 | Huang et al. |
| 8,362,575 B2 | 1/2013 | Kwok et al. |
| 8,367,498 B2 | 2/2013 | Chang et al. |
| 8,367,520 B2 | 2/2013 | Arena |
| 8,383,503 B2 | 2/2013 | Johnson |
| 8,384,195 B2 | 2/2013 | Wang et al. |
| 8,384,196 B2 | 2/2013 | Cheng et al. |
| 8,399,931 B2 | 3/2013 | Liaw et al. |
| 8,415,209 B2 | 4/2013 | Rooyackers et al. |
| 8,415,718 B2 | 4/2013 | Xu |
| 8,426,923 B2 | 4/2013 | Lee et al. |
| 8,435,845 B2 | 5/2013 | Ning et al. |
| 8,440,517 B2 | 5/2013 | Lin et al. |
| 8,450,165 B2 | 5/2013 | Bohr |
| 8,455,857 B2 | 6/2013 | Samuelson et al. |
| 8,455,929 B2 | 6/2013 | Ko |
| 8,486,770 B1 | 7/2013 | Wu et al. |
| 8,502,263 B2 | 8/2013 | Li et al. |
| 8,536,440 B2 | 9/2013 | Lagally et al. |
| 8,569,741 B2 | 10/2013 | Scherer et al. |
| 8,574,969 B2 | 11/2013 | Cohen et al. |
| 8,580,642 B1 | 11/2013 | Maszara et al. |
| 8,609,497 B2 | 12/2013 | Chung et al. |
| 8,618,556 B2 | 12/2013 | Wu et al. |
| 8,624,326 B2 | 1/2014 | Chen et al. |
| 8,629,477 B2 | 1/2014 | Lochtefeld et al. |
| 8,633,471 B2 | 1/2014 | Pillarisetty et al. |
| 8,652,891 B1 | 2/2014 | Yin et al. |
| 8,652,932 B2 | 2/2014 | Adam et al. |
| 8,664,060 B2 | 3/2014 | Liu et al. |
| 8,669,147 B2 | 3/2014 | Pham et al. |
| 8,669,615 B1 | 3/2014 | Chang et al. |
| 8,680,576 B2 | 3/2014 | Ching et al. |
| 8,685,825 B2 | 4/2014 | Tang et al. |
| 8,697,522 B2 | 4/2014 | Cheng et al. |
| 8,716,764 B2 | 5/2014 | Fumitake |
| 8,722,501 B2 | 5/2014 | Tsai et al. |
| 8,723,272 B2 | 5/2014 | Liu et al. |
| 8,728,881 B2 | 5/2014 | Zhu et al. |
| 8,729,559 B2 | 5/2014 | Krames et al. |
| 8,729,627 B2 | 5/2014 | Cheng et al. |
| 8,735,993 B2 | 5/2014 | Lo et al. |
| 8,742,509 B2 | 6/2014 | Lee et al. |
| 8,753,942 B2 | 6/2014 | Kuhn et al. |
| 8,796,537 B2 | 8/2014 | Sun et al. |
| 8,796,734 B2 | 8/2014 | Lochtefeld et al. |
| 8,809,093 B2 | 8/2014 | Homyk et al. |
| 8,809,131 B2 | 8/2014 | Bangsaruntip et al. |
| 8,821,635 B2 | 9/2014 | Kouvetakis et al. |
| 8,822,248 B2 | 9/2014 | Park |
| 8,841,701 B2 | 9/2014 | Lin et al. |
| 8,890,207 B2 | 11/2014 | Wu et al. |
| 8,912,603 B2 | 12/2014 | Luning et al. |
| 8,928,093 B2 | 1/2015 | Lo et al. |
| 8,937,353 B2 | 1/2015 | Chen et al. |
| 8,946,033 B2 | 2/2015 | Adam et al. |
| 8,963,206 B2 | 2/2015 | Colinge |
| 8,981,427 B2 | 3/2015 | Hydrick et al. |
| 8,987,835 B2 | 3/2015 | Vellianitis et al. |
| 8,993,402 B2 | 3/2015 | Kanike et al. |
| 8,994,104 B2 | 3/2015 | Glass et al. |
| 9,012,284 B2 | 4/2015 | Glass et al. |
| 9,048,260 B2 | 6/2015 | Jhaveri et al. |
| 9,054,187 B2 | 6/2015 | Liu et al. |
| 9,059,207 B2 | 6/2015 | Adam et al. |
| 9,059,292 B2 | 6/2015 | Ontalus et al. |
| 9,070,706 B2 | 6/2015 | Cho et al. |
| 9,082,873 B2 | 7/2015 | Yamashita et al. |
| 9,087,687 B2 | 7/2015 | Adam et al. |
| 9,099,388 B2 | 8/2015 | Lin et al. |
| 9,105,661 B2 | 8/2015 | Huang et al. |
| 9,142,400 B1 | 9/2015 | Brueck et al. |
| 9,153,583 B2 | 10/2015 | Glass et al. |
| 9,153,645 B2 | 10/2015 | Li et al. |
| 9,166,022 B2 | 10/2015 | Xu et al. |
| 9,209,300 B2 | 12/2015 | Lin et al. |
| 9,219,139 B2 | 12/2015 | Adam et al. |
| 9,245,805 B2 | 1/2016 | Yeh et al. |
| 9,281,402 B2 | 3/2016 | Tang et al. |
| 9,318,326 B2 | 4/2016 | Von Kanel et al. |
| 9,385,050 B2 | 7/2016 | Haensch et al. |
| 9,476,143 B2 | 10/2016 | Vincent et al. |
| 9,502,419 B2 | 11/2016 | Liaw |
| 9,530,843 B2 | 12/2016 | Adam et al. |
| 9,595,614 B2 | 3/2017 | Wu et al. |
| 9,607,987 B2 | 3/2017 | Giles et al. |

(56) References Cited

U.S. PATENT DOCUMENTS

| | | | |
|---|---|---|---|
| 9,653,286 | B2 | 5/2017 | Ohlsson et al. |
| 9,716,044 | B2 | 7/2017 | Chang et al. |
| 9,728,464 | B2 | 8/2017 | Glass et al. |
| 9,761,666 | B2 | 9/2017 | Van Dal et al. |
| 9,768,305 | B2 | 9/2017 | Ko |
| 9,786,782 | B2 | 10/2017 | Balakrishnan et al. |
| 9,923,054 | B2 | 3/2018 | Jhaveri et al. |
| 9,953,885 | B2 | 4/2018 | Yuan et al. |
| 9,985,131 | B2 | 5/2018 | Ma et al. |
| 10,074,536 | B2 | 9/2018 | Lochtefeld |
| 10,141,418 | B1 | 11/2018 | Brueck et al. |
| 2001/0006249 | A1 | 7/2001 | Fitzgerald |
| 2003/0015704 | A1 | 1/2003 | Curless |
| 2003/0054608 | A1 | 3/2003 | Tseng et al. |
| 2003/0089899 | A1 | 5/2003 | Lieber et al. |
| 2003/0168002 | A1 | 9/2003 | Zaidi |
| 2005/0017304 | A1 | 1/2005 | Matsushita et al. |
| 2005/0077553 | A1 | 4/2005 | Kim et al. |
| 2005/0167655 | A1 | 8/2005 | Furukawa et al. |
| 2005/0184302 | A1 | 8/2005 | Kobayashi et al. |
| 2006/0113603 | A1 | 6/2006 | Currie |
| 2006/0154439 | A1 | 7/2006 | Lim |
| 2006/0207647 | A1 | 9/2006 | Tsakalakos et al. |
| 2006/0292719 | A1 | 12/2006 | Lochtefeld et al. |
| 2007/0183185 | A1 | 8/2007 | Guo et al. |
| 2007/0187668 | A1 | 8/2007 | Noguchi et al. |
| 2007/0221956 | A1 | 9/2007 | Inaba |
| 2007/0235819 | A1 | 10/2007 | Yagishita |
| 2007/0267722 | A1 | 11/2007 | Lochtefeld et al. |
| 2008/0036038 | A1 | 2/2008 | Hersee et al. |
| 2008/0070355 | A1 | 3/2008 | Lochtefeld et al. |
| 2008/0073667 | A1 | 3/2008 | Locktefeld |
| 2008/0099785 | A1 | 5/2008 | Bai et al. |
| 2008/0149914 | A1* | 6/2008 | Samuelson ............ B82Y 10/00 257/9 |
| 2008/0149944 | A1 | 6/2008 | Samuelson et al. |
| 2008/0187018 | A1 | 8/2008 | Li |
| 2008/0230802 | A1 | 9/2008 | Bakkers et al. |
| 2008/0315430 | A1 | 12/2008 | Weber et al. |
| 2009/0039361 | A1 | 2/2009 | Li et al. |
| 2009/0223558 | A1 | 9/2009 | Sun et al. |
| 2011/0031470 | A1 | 2/2011 | Scherer et al. |
| 2011/0042744 | A1 | 2/2011 | Cheng et al. |
| 2011/0097881 | A1 | 4/2011 | Vandervorst et al. |
| 2011/0100411 | A1 | 5/2011 | Lagally et al. |
| 2011/0101456 | A1 | 5/2011 | Hoentschel et al. |
| 2011/0140085 | A1 | 6/2011 | Homyk et al. |
| 2011/0163242 | A1 | 7/2011 | Mao et al. |
| 2011/0169012 | A1 | 7/2011 | Hersee et al. |
| 2011/0193141 | A1 | 8/2011 | Lin et al. |
| 2011/0193175 | A1 | 8/2011 | Huang et al. |
| 2011/0233512 | A1 | 9/2011 | Vang et al. |
| 2011/0272763 | A1 | 11/2011 | Sasaki et al. |
| 2012/0091465 | A1 | 4/2012 | Krames et al. |
| 2012/0091538 | A1 | 4/2012 | Lin et al. |
| 2012/0217474 | A1 | 8/2012 | Zang et al. |
| 2012/0319211 | A1 | 12/2012 | van Dal et al. |
| 2013/0037857 | A1 | 2/2013 | Von Kanel et al. |
| 2013/0049068 | A1 | 2/2013 | Lin et al. |
| 2013/0092984 | A1* | 4/2013 | Liu ..................... H01L 29/7845 257/288 |
| 2013/0161756 | A1 | 6/2013 | Glass et al. |
| 2013/0168771 | A1 | 7/2013 | Wu et al. |
| 2013/0193446 | A1* | 8/2013 | Chao ................. H01L 21/02664 257/77 |
| 2013/0200470 | A1 | 8/2013 | Liu et al. |
| 2013/0302954 | A1 | 11/2013 | Lutz |
| 2013/0309838 | A1 | 11/2013 | Wei et al. |
| 2013/0309847 | A1 | 11/2013 | Maszara et al. |
| 2014/0001520 | A1 | 1/2014 | Glass et al. |
| 2014/0264488 | A1 | 9/2014 | Fronheiser et al. |
| 2015/0014631 | A1 | 1/2015 | Ohlsson et al. |

FOREIGN PATENT DOCUMENTS

| | | | |
|---|---|---|---|
| KR | 20010009416 | A | 2/2001 |
| KR | 20010036380 | A | 5/2001 |
| KR | 20010112738 | A | 12/2001 |
| KR | 20040055463 | A | 6/2004 |
| KR | 20090097424 | A | 9/2009 |
| KR | 1020040055463 | | 2/2011 |
| WO | 8901235 | A1 | 2/1989 |
| WO | 8901236 | A1 | 2/1989 |
| WO | 0077831 | A2 | 12/2000 |
| WO | 2005048330 | A1 | 5/2005 |
| WO | 2005098963 | A1 | 10/2005 |
| WO | 2006125040 | A2 | 11/2006 |
| WO | 2011135432 | A1 | 11/2011 |

OTHER PUBLICATIONS

Matsunaga et al., A new way to achieve dislocation-free heteroepitaxial growth by molecular beam epitaxy: vertical microchannel epitaxy, Journal of Crystal Growth, Apr. 1, 2002, pp. 1460-1465, vol. 237-239, University of Tokyo, Japan.

Vanamu et al., Heteroepitaxial growth on microscale patterned silicon structures, Journal of Crystal Growth, 2005, pp. 66-74, vol. 280, Elsevier, University of New Mexico, Albuquerque, NM.

Nguyen et al., Selective epitaxial growth of III-V semiconductor heterostructures on Si substrates for logic applications, Abstract #1952, 218th, ECS Meeting, 2010, 1 page, The Electrochemical Society, Belgium.

Verheyen et al., 25% Drive Current improvement for p-type Multiple Gate FET (MuGFET) Devices by the Introduction of Recessed Si0.8Ge0.2 in the Source and Drain Regions, Digest of Technical Papers, 2005, 15 pages, Symposium on VLSI Technology, Kyoto, Japan.

Huang, X et al., Sub-50nm P-Channel FinFET, Transactions on Electron Devices, May 2001, p. 880, vol. 48, No. 5, Institute of Electrical and Electronics Engineers (IEEE), USA.

Hisamoto et al., FinFET—a Self-Aligned Double-Gate MOSFET Scalable to 20nm, Transactions on Electron Devices, Dec. 2000, pp. 2320-2325, vol. 47, No. 12, Institute of Electrical and Electronics Engineers (IEEE), USA.

Plummer et al., Silicon VLSI Technology, Fundamentals, Practice and Modeling, 2000, Department of Electrical Engineering, Stanford University, USA.

Wang et al., Ge instability and the growth of Ge epitaxial layers in nanochannels on patterned Si (001) substrates, Journal of Applied Physics, 2010, p. 123517, vol. 108, No. 12, American Institute of Physics, USA.

Neamen, D A, Semiconductor Physics and Devices—Basic Principles, 3rd edition., 2003, McGraw-Hill Higher Education, USA.

Kilchytska et al., Perspective of FinFETs for analog applications, Proceedings of the 30th European Solid-State Circuits Conference, Sep. 22-23, 2004, Institute of Elecrical and Electronics Engineers (IEEE), USA.

Hu, C, Modern Semiconductor Devices for Integrated Circuits, 1st edition, 2009, USA.

Langdo et al., High Quality Ge on Si by epitaxial necking, Applied Physics Letters, vol. 76, No. 25, Jun. 19, 2000, 6 pages.

Dutta et al., "Novel properties of graphene nanoribbons: a review", Journal of Materials Chemistry, 2010, vol. 20, 17 pages.

Larrieu et al., "Vertical nanowire array-based field effect transistors for ultimate scaling", Nanoscale, 2013, vol. 5, 5 pages.

Rahman, A. Novel channel materials for ballistic nanoscale MOSFETs—bandstructure effects. IEDM, 2005, pp. 1-4.

Datta, S. 85nm Gate Length Enhancement and Depletion mode InSb Quantum Well Transistors for Ultra High Speed and Very Low Power Digital Logic Applications. IEDM, 2005, pp. 1-4.

Iwai, H. Recent Status on Nano CMOS and Future Direction. Intl. Conf. on Nano-CMOS, IEEE, 2006, pp. 1-5.

Brammertz, G. et al. Selective epitaxial growth of GaAs on Ge by MOCVD. Journal of Crystal Growth, 2006, vol. 297, pp. 204-210.

(56) References Cited

OTHER PUBLICATIONS

Datta, S. Ultrahigh-Speed 0.5 V Supply Voltage In0.7Ga0.3As Quantum-Well Transistors on Silicon Substrate. IEEE Electron Device Letters, Aug. 2007, vol. 28, No. 8, pp. 685-687.
Do, Q.-T. et al. High Transconductance MISFET with a Single InAs Nanowire Channel. IEEE Electron Device Letters. Aug. 2007, vol. 28, No. 8, pp. 682-684.
Park, J.-S. et al. Defect reduction of selective Ge epitaxy in trenches on Si (001) substrates using aspect ratio trapping. Applied Physics Letters 90, 2007, pp. 052113/1-052113/3.
Ashley, T. et al. Heterogeneous InSb quantum well transistors on silicon for ultra-high speed, low power logic applications. Electronics Letters, Jul. 5, 2007, vol. 43, No. 14, 2 Pages.
Bourianoff, G. I. et al. Research directions in beyond CMOS computing. Solid-State Electronics, 2007, vol. 51, pp. 1426-1431.
Hu, Y. et al. Sub-100 Nanometer Channel Length Ge/Si Nanowire Transistors with Potential for 2 THz Switching Speed. Nano Letters, 2008, vol. 8, No. 3, pp. 925-930.
Verhulst, A. S. et al. Complementary Silicon-Based Heterostructure Tunnel-FETs With High Tunnel Rates. IEEE Electron Device Letters, 2008, vol. 29, pp. 1-4.
Wu, Y. Q. et al. 0.8-V Supply Voltage Deep-Submicrometer Inversion-Mode In0.75Ga0.25As MOSFET, IEEE Electron Device Letters, Jul. 2009, vol. 30, No. 7, pp. 700-702.
Doornbos, G. et al. Benchmarking of III-V n-MOSFET Maturity and Feasibility for Future CMOS. IEEE Electron Device Letters, Oct. 2010, vol. 31, No. 10, pp. 1110-1112.
Lubow, A. et al. Comparison of drive currents in metal-oxide-semiconductor field-effect transistors made of Si, Ge, GaAs, InGaAs, and InAs channels. Applied Physics Letters, 2010, vol. 96, pp. 122105/1-122105/3.
Moutanabbir, O. et al. Heterogeneous Integration of Compound Semiconductors. Annu. Rev. Mater. Res., 2010, vol. 40. pp. 469-500.
Wang, G. et a. Fabrication of high quality Ge virtual substrates by selective epitaxial growth in shallow trench isolated Si (001) trenches. Thin Solid Films, 2010, vol. 518, pp. 2538-2541.
Bessire, C. D. et al. Trap-Assisted Tunneling in Si-InAs Nanowire Heterojunction Tunnel Diodes. Nano Letters, 2011, vol. 11. pp. A-E.
Kim, S-H. et al. Electron Mobility Enhancement of Extremely Thin Body In0:7Ga0:3As-on-Insulator Metal-Oxide-Semiconductor Field-Effect Transistors on Si Substrates by Metal-Oxide-Semiconductor Interface Buffer Layers. Applied Physics Express, 2012, vol. 5, pp. 014201/1-014201-3.
Takei, K. et al. Nanoscale InGaSb Heterostructure Membranes on Si Substrates for High Hole Mobility Transistors. Nano Letters, 2012, vol. 12, pp. 2060-2066.
Hwang, E. et al. Investigation of scalability of In0.7Ga0.3As quantum well field effect transistor (QWFET) architecture for logic applications. Solid-State Electronics, 2011, pp. 1-8.
Long, Wei et al. Dual-Material Gate (DMG) Field Effect Transistor. IEEE Transactions on Electron Devices, May 1999, vol. 46, No. 5, pp. 865-870.
Hsu, Chao-Wei et al. Dislocation reduction of InAs nanofins prepared on Si substrate using metal-organic vapor-phase epitaxy. Nanoscale Research Letters, 2012(7):1-4.
Kavalieros, J. et al., "Tri-Gate Transistor Architecture with High-k Gate Dielectrics, Metal Gates and Strain Engineering", IEEE, Symposium on VLSI Technology Digest of Technical Papers, 2006, 2 pages.
Jurczak, M. et al., "Review of FINFET technology", IEEE, 2009, 4 pages.
Vanamu, "Epitaxial Growth of High-quality Ge Films on Nanostructured Silicon Substrates", Applied Physics Letters, vol. 88, May 16, 2006.
Ieong, "High Performance CMOS Fabricated on Hybrid Substrate with Different Crystal Orientations", IEEE, 2003.
Yoon, "Selective Growth of Ge Islands on Noanometer-scale Patterned SiO2/Si Substrate by Molecular Beam Epitaxy", Applied Physics Letters, vol. 89, Jul. 5, 2006.

Zang, "Nanoheteroepitaxial lateral overgrowth of GaN on nanoporous Si(111)", Applied Physics Letters, vol. 88, Apr. 7, 2006.
Zang, "Nanoscale lateral epitaxial overgrowth of GaN on Si (111)", Applied Physics Letters, vol. 87, Nov. 3, 2005.
Zela, "Single-crystalline Ge grown epitaxially on oxidized and reduced Ge/Si (1 0 0) islands", Journal of Crystal Growth, vol. 263, 2004.
Maiti, "Applications of Silicon-Germanium Heterostructure Devices", Institute of Physics Publishing, 2001.
Fiorenza, "Aspect Ratio Trapping: A Unique Technology for Integrating Ge and III V with Silicon CMOS", ECS Transactions, vol. 33, 2010.
Choi, "Nanoscale CMOS Spacer FinFET for the Terabit Era", IEEE Electron Device Letters, vol. 23, Jan. 2002.
Chidambaram, "35% Drive Current Improvement from Recessed-SiGe Drain Extensions on 37 nm Gate Length PMOS", 2004 Symposium on VLSI Technology Digest of Technical Papers, 2004.
Choi, "Sub-20 nm CMOS FinFET technologies", IEDM, 2001.
Park, "Defect reduction of selective Ge epitaxy in trenches on Si(001) substrates using aspect ratio trapping", Applied Physics Letters, vol. 90, Feb. 2, 2007.
Loo, "Selective Area Growth of InP on on-axis Si(001) Substrates with Low Antiphase Boundary Formation", ECS Transactions, vol. 41,2011.
Park, "Low-Defect-Density Ge Epitaxy on Si(001) Using Aspect Ratio Trapping and Epitaxial Lateral Overgrowth", Electrochemical and Solid-State Letters, vol. 12, Jan. 30, 2009.
Iza, "Nanostructured conformal hybrid solar cells: A promising architecture towards complete charge collection and light absorption", Nanoscale Research Letters, vol. 8, 2013.
Madou, "Manufacturing Techniques for Microfabrication & Nanotechnology", vol. II, CRC Press, 2011.
Yu, "Relationships Between Gas-Phase Film Deposition, Properties and Structures of Thin SiO2 and BPSG Films", Journal of the Electrochemical Society, vol. 150, Oct. 23, 2003.
Wang, "Selective Epitaxial Growth of Germanium on Si Wafers with Shallow Trench Isolation: An Approach for Ge Virtual Substrates", ECS Transactions, vol. 16, 2008.
Leonhardt, "Selective epitaxial growth techniques to integrate high-quality germanium on silicon", UNM Digital Repository, Jul. 2, 2011.
"Crystallography of Silicon", MicroChemicals GmbH.
Lind, "Improved Subthreshold Slope in an InAs Nanowire Heterostructure Field-Effect Transistor", Nano Letters, vol. 6, 2006.
Schmidt, "Realization of a Silicon Nanowire Vertical Surround-Gate Field-Effect Transistor", Small, vol. 2, 2006.
Yu, "III-V Compounds-on-Si Heterostructure Fabrication, Application and Prospects", The Open Nanoscience Journal, vol. 3, 2009.
Lee, "Growth of GaN on a nanoscale-faceted Si substrate by metal-organic vapor-phase epitaxy", IEEE, 2003.
Li, "Heteroepitaxy of high-quality Ge on Si by nanoscale seed pads grown through a SiO2 interlayer", SPIE, Apr. 4, 2005.
Lee, "Anisotropy of selective epitaxy in nanoscale-patterned growth: GaAs nanowires selectively grown on a SiO2-patterned (001) substrate by molecular-beam epitaxy", Journal of Applied Physics, vol. 98, Dec. 13, 2005.
Bokhovityanov et al., "GaAs epitaxy on Si substrates: modern status of research and engineering", Uspekhi Fizicheskikh Nauk, Russian Academy of Sciences, vol. 51, 2008.
Sun, "Defect reduction mechanisms in the nanoheteroepitaxy of GaN on SiC", Journal of Applied Physics, Jan. 20, 2004.
Mehta, "Electrical Design Optimization of Single-Mode Tunnel-Junction-Based Long-Wavelength VCSELs", IEEE Journal of Quantum Electronics, vol. 42, Jul. 2006.
Lee, "Epitaxial growth of a nanoscale, vertically faceted, one-dimensional, high-aspect ratio grating in III-V materials for integrated photonics", Applied Physics Letters, vol. 87, Aug. 12, 2005.
Wang, "Fabrication of GaN nanowire arrays by confined epitaxy", Applied Physics Letters, vol. 89, Dec. 7, 2006.
Li, "Formation of Epitaxial Ge Nanorings on Si by Self-assembled SiO2 Particles and Touchdown of Ge Through a Thin Layer of SiO2", Material Research Society, 2006.

(56) References Cited

OTHER PUBLICATIONS

Lee, "GaAs on Si(111)—crystal shape and strain relaxation in nanoscale patterned growth", Applied Physics Letters, vol. 87, Jul. 6, 2005.
Lee, "Heteroepitaxial selective growth of InxGa1-xAS on SiO2-patterned GaAs(001) by molecular beam epitaxy", Journal of Applied Physics, Oct. 28, 2004.
Feezell, "InP-Based 1.3- 1.6-μm VCSELs With Selectively Etched Tunnel-Junction Apertures on a Wavelength Flexible Platform", IEEE Photonics Technology Letters, vol. 17, Oct. 2005.
Feezell, "InP-Based All-Epitaxial 1.3-μm VCSELs With Selectively Etched AlInAs Apertures and Sb-Based DBRs", IEEE Photonics Technology Letters, vol. 15, Nov. 2003.
Zubia, "Nanoheteroepitaxial growth of GaN on Si by organometallic vapor phase epitaxy", Applied Physics Letters, vol. 76, Feb. 4, 2000.
Feezell, "Optical Design of InAlGaAs Low-Loss Tunnel-Junction Apertures for Long-Wavelength Vertical-Cavity Lasers", IEEE Journal of Quantum Electronics, vol. 42 , May 2006.
Lee, "Orientation-dependent nucleation of GaN on a nanoscale faceted Si surface", Journal of Crystal Growth, vol. 279, Apr. 7, 2005.
Ferdous, "Photoelectrochemical etching measurement of defect density in GaN grown by nanoheteroepitaxy", Journal of Applied Physics, May 15, 2006.
Lee, "Scaling of the surface migration length in nanoscale patterned growth", Applied Physics Letters, vol. 94, Apr. 16, 2009.
Fan, "Second Harmonic Generation from a Nanopatterned Isotropic Nonlinear Material", Nano Letters, vol. 6, 2006.
Lee, "Spatial phase separation of GaN selectively grown on a nanoscale faceted Si surface", Applied Physics Letters, vol. 84, Mar. 16, 2004.
Lee, "Strain-relieved, dislocation-free InxGa1-xAS / GaAs(001) heterostructure by nanoscale-patterned growth", Applied Physics Letters, vol. 85, Nov. 3, 2004.
Swaine, "Could Silicon Valley become Gallium Gulch?", InfoWorld: The Newsweekly for Microcomputer Users, vol. 4, No. 29, Jul. 26, 1982.
Brueck, "There are NO Fundamental Limits to Optical Nanolithography", IEEE, 2004.
Wang, "Molecular beam epitaxial growth and material properties of GaAs and AlGaAs on Si (100)", Applied Physics Letters, vol. 44, Jun. 4, 1984.
*Samsung Electronics Co., Ltd* vs. *STC. UNM*, Patent Owner's Preliminary Response for U.S. Pat. No. 9,142,400, United States Patent And Tradmark Office, Case No. IPR2020-00009, Feb. 13, 2020, (75 Pages).
"Exhibit 2101", Declaration of Harlan Rusty Harris, Ph.D., *Samsung Electronics Co., Ltd* vs. *STC. UNM*, Patent Owner's Preliminary Response for U.S. Pat. No. 9,142,400, United States Patent and Tradmark Office, Case No. IPR2020-00009, Feb. 13, 2020, (67 Pages).
"Exhibit 2112", Press Release, Mark Bohr and Kaizad Mistry, Intel Corp. (2011) Intel's Revolutionary 22 nm Transistor Technology, May 2, 2011. Available at: https://newsroom.intel.com/press-kits/intel-22nm-3-d-tri-gate-transistor-technology/#gs.wap6u0, *Samsung Electronics Co., Ltd* vs. *STC. UNM*, Patent Owner's Preliminary Response for U.S. Pat. No. 9,142,400, United States Patent and Tradmark Office, Case No. IPR2020-00009, dated Feb. 13, 2020.
*Samsung Electronics Co., Ltd* vs. *STC. UNM*, Patent Owner's Preliminary Response for U.S. Pat. No. 9,142,400, United States Patent and Tradmark Office, Case No. IPR2020-00009, dated Feb. 13, 2020, (75 Pages).
"Exhibit 2101", Declaration of Harlan Rusty Harris, Ph.D., *Samsung Electronics Co., Ltd* vs. *STC. UNM*, Patent Owner's Preliminary Response for U.S. Pat. No. 9,142,400, United States Patent and Tradmark Office, Case No. IPR2020-00009, dated Feb. 13, 2020, (67 Pages).
"Exhibit 2102", Order Governing Proceedings, C.A. No. 6:19-CV-00329-ADA, *Samsung Electronics Co., Ltd* vs. *STC. UNM*, Patent Owner's Preliminary Response for U.S. Pat. No. 9,142,400, United States Patent and Tradmark Office, Case No. IPR2020-00009, dated Feb. 13, 2020.
"Exhibit 2103", Samsung Defendants Preliminary Invalidity Contentions, C.A. No. 6:19-CV-00329-ADA (Nov. 1, 2019), *Samsung Electronics Co., Ltd* vs. *STC. UNM*, Patent Owner's Preliminary Response for U.S. Pat. No. 9,142,400, United States Patent and Tradmark Office, Case No. IPR2020-00009, dated Feb. 13, 2020.
"Exhibit 2104", Appendix A1 to Samsung Defendants Preliminary Invalidity Contentions, C.A. No. 6:19-CV-00329-ADA (Nov. 1, 2019), *Samsung Electronics Co., Ltd* vs. *STC. UNM*, Patent Owner's Preliminary Response for U.S. Pat. No. 9,142,400, United States Patent and Tradmark Office, Case No. IPR2020-00009, dated Feb. 13, 2020.
"Exhibit 2105", Appendix A2 to Samsung Defendants Preliminary Invalidity Contentions, C.A. No. 6:19-CV-00329-ADA (Nov. 1, 2019), *Samsung Electronics Co., Ltd* vs. *STC. UNM*, Patent Owner's Preliminary Response for U.S. Pat. No. 9,142,400, United States Patent and Tradmark Office, Case No. IPR2020-00009, dated Feb. 13, 2020.
"Exhibit 2106", Samsung Defendants' Opening Claim Construction Brief, C.A. No. 6:19-CV-00329-ADA, *Samsung Electronics Co., Ltd* vs. *STC. UNM*, Patent Owner's Preliminary Response for U.S. Pat. No. 9,142,400, United States Patent and Tradmark Office, Case No. IPR2020-00009, dated Feb. 13, 2020.
"Exhibit 2107", STC.UNM's Opening Claim Construction Brief, C.A. No. 6:19 CV 00329 ADA, *Samsung Electronics Co., Ltd* vs. *STC. UNM*, Patent Owner's Preliminary Response for U.S. Pat. No. 9,142,400, United States Patent and Tradmark Office, Case No. IPR2020-00009, dated Feb. 13, 2020.
"Exhibit 2108", Samsung Defendants' Responsive Claim Construction Brief, C.A. No. 6:19-CV-00329-ADA, *Samsung Electronics Co., Ltd* vs. *STC. UNM*, Patent Owner's Preliminary Response for U.S. Pat. No. 9,142,400, United States Patent and Tradmark Office, Case No. IPR2020-00009, dated Feb. 13, 2020.
"Exhibit 2109", STC.UNM's Responsive Claim Construction Brief, C.A. No. 6:19-CV-00329-ADA, *Samsung Electronics Co., Ltd* vs. *STC. UNM*, Patent Owner's Preliminary Response for U.S. Pat. No. 9,142,400, United States Patent and Tradmark Office, Case No. IPR2020-00009, dated Feb. 13, 2020.
"Exhibit 2110", Samsung Defendants' Reply Claim Construction Brief, C.A. No. 6:19-CV-00329-ADA, *Samsung Electronics Co., Ltd* vs. *STC. UNM*, Patent Owner's Preliminary Response for U.S. Pat. No. 9,142,400, United States Patent and Tradmark Office, Case No. IPR2020-00009, dated Feb. 13, 2020.
"Exhibit 2111", STC.UNM's Reply Claim Construction Brief, C.A. No. 6:19-CV-00329-ADA, *Samsung Electronics Co., Ltd* vs. *STC. UNM*, Patent Owner's Preliminary Response for U.S. Pat. No. 9,142,400, United States Patent and Tradmark Office, Case No. IPR2020-00009, dated Feb. 13, 2020.
"Exhibit 2113", Jan et al., "A 22nm SoC platform technology featuring 3-D tri-gate and high-k/metal gate, optimized for ultra low power, high performance and high density SoC applications," 2012 International Electron Devices Meeting, San Francisco, CA, 2012, pp. 3.1.1-3.1.4. doi: 10.1109/IEDM.2012.6478969, *Samsung Electronics Co., Ltd* vs. *STC. UNM*, Patent Owner's Preliminary Response for U.S. Pat. No. 9,142,400, United States Patent and Tradmark Office, Case No. IPR2020-00009, dated Feb. 13, 2020.
"Exhibit 2114", Ben Streetman and Sanjay Banerjee, Solid State Electronic Devices (5th Edition), Prentice Hall, New Jersey, 1999, *Samsung Electronics Co., Ltd* vs. *STC. UNM*, Patent Owner's Preliminary Response for U.S. Pat. No. 9,142,400, United States Patent and Tradmark Office, Case No. IPR2020-00009, dated Feb. 13, 2020.
"Exhibit 2001", Transcript of Telephonic Hearing in *Taiwan Semiconductor Manufacturing Co. Ltd* v. *STC.UNM* (IPR2019-01410) held on Oct. 7, 2019, *Taiwan Semiconductor Manufacturing Co. LTD* vs. *STC. UNM*, Patent Owner's Preliminary Response for U.S. Pat. No. 9,142,400, United States Patent and Tradmark Office, Case No. IPR2019-01410, dated Feb. 13, 2020.
"Exhibit 2002", U.S. Patent Publication No. 2011/0193141, *Taiwan Semiconductor Manufacturing Co. Ltd* vs. *STC. UNM*, Patent

(56) References Cited

OTHER PUBLICATIONS

Owner's Preliminary Response for U.S. Pat. No. 9,142,400, United States Patent and Trademark Office, Case No. IPR2019-01410, dated Feb. 13, 2020.
"Exhibit 2003", U.S. Pat. No. 8,236,634, *Taiwan Semiconductor Manufacturing Co. Ltd* vs. *STC. UNM*, Patent Owner's Preliminary Response for U.S. Pat. No. 9,142,400, United States Patent and Tradmark Office, Case No. IPR2019-01410, dated Feb. 13, 2020.
"Exhibit 2004", U.S. Pat. No. 8,652,932, *Taiwan Semiconductor Manufacturing Co. Ltd* vs. *STC. UNM*, Patent Owner's Preliminary Response for U.S. Pat. No. 9,142,400, United States Patent and Tradmark Office, Case No. IPR2019-01410, dated Feb. 13, 2020.
"Exhibit 2005", U.S. Pat. No. 9,385,050, *Taiwan Semiconductor Manufacturing Co. Ltd* vs. *STC. UNM*, Patent Owner's Preliminary Response for U.S. Pat. No. 9,142,400, United States Patent and Tradmark Office, Case No. IPR2019-01410, dated Feb. 13, 2020.
"Exhibit 2006", Chang et al., "Electrical characteristics dependence on the channel fin aspect ratio of multi-fin field effect transistors," Semiconductor Science and Technology 24 (2009)., *Taiwan Semiconductor Manufacturing Co. Ltd* vs. *STC. UNM*, Patent Owner's Preliminary Response for U.S. Pat. No. 9,142,400, United States Patent and Trademark Office, Case No. IPR2019-01410, dated Feb. 13, 2020.
"Exhibit 2007", Ho et al., "Design Optimization of Multigate Bulk MOSFETs," IEEE Transactions on Electron Devices, vol. 60, No. 1 (Jan. 2013), *Taiwan Semiconductor Manufacturing Co. Ltd* vs. *STC. UNM*, Patent Owner's Preliminary Response for U.S. Pat. No. 9,142,400, United States Patent and Tradmark Office, Case No. IPR2019-01410, dated Feb. 13, 2020.
"Exhibit 2008", Cambridge Online Dictionary, definition "pedestal," available at https://dictionary.cambridge.org/us/dictionary/english/pedestal (last accessed Feb. 11, 2020), *Taiwan Semiconductor Manufacturing Co. Ltd* vs. *STC. UNM*, Patent Owner's Preliminary Response for U.S. Pat. No. 9,142,400, United States Patent and Tradmark Office, Case No. IPR2019-01410, dated Feb. 13, 2020.
"Exhibit 2009", U.S. Pat. No. 3,958,040, *Taiwan Semiconductor Manufacturing Co. Ltd* vs. *STC. UNM*, Patent Owner's Preliminary Response for U.S. Pat. No. 9,142,400, United States Patent and Tradmark Office, Case No. IPR2019-01410, dated Feb. 13, 2020.
"Exhibit 2010", U.S. Pat. No. 5,661,313, *Taiwan Semiconductor Manufacturing Co. Ltd* vs. *STC. UNM*, Patent Owner's Preliminary Response for U.S. Pat. No. 9,142,400, United States Patent and Tradmark Office, Case No. IPR2019-01410, dated Feb. 13, 2020.
"Exhibit 2011", U.S. Pat. No. 9,786,782, *Taiwan Semiconductor Manufacturing Co. Ltd* vs. *STC. UNM*, Patent Owner's Preliminary Response for U.S. Pat. No. 9,142,400, United States Patent and Tradmark Office, Case No. IPR2019-01410, dated Feb. 13, 2020.
"Exhibit 2012", U.S. Pat. No. 6,049,650, *Taiwan Semiconductor Manufacturing Co. Ltd* vs. *STC. UNM*, Patent Owner's Preliminary Response for U.S. Pat. No. 9,142,400, United States Patent and Tradmark Office, Case No. IPR2019-01410, dated Feb. 13, 2020.
"Exhibit 2013", Taiwan Semiconductor Manufacturing Co. Limited's and TSMC North America, Inc.'s Opening Claim Construction Brief in Civil Action No. 6:19-cv-00261-ADA, *Taiwan Semiconductor Manufacturing Co. Ltd* vs. *STC. UNM*, Patent Owner's Preliminary Response for U.S. Pat. No. 9,142,400, United States Patent and Tradmark Office, Case No. IPR2019-01410, dated Feb. 13, 2020.
"Exhibit 2014", Declaration of Stephen A. Campbell dated Jan. 31, 2020 in Civil Action No. 6:19-cv-00261-ADA, *Taiwan Semiconductor Manufacturing Co. Ltd* vs. *STC. UNM*, Patent Owner's Preliminary Response for U.S. Pat. No. 9,142,400, United States Patent and Tradmark Office, Case No. IPR2019-01410, dated Feb. 13, 2020.
"Exhibit 2015", STC.UNM's Opening Claim Construction Brief in Civil Action No. 6:19-cv-00261-ADA, *Taiwan Semiconductor Manufacturing Co. Ltd* vs. *STC. UNM*, Patent Owner's Preliminary Response for U.S. Pat. No. 9,142,400, United States Patent and Tradmark Office, Case No. IPR2019-01410, dated Feb. 13, 2020.
"Exhibit 2016", Taiwan Semiconductor Manufacturing Co. Limited's and TSMC North America, Inc.'s Responsive Claim Construction Brief in Civil Action No. 6:19-cv-00261-ADA, *Taiwan Semiconductor Manufacturing Co. Ltd* vs. *STC. UNM*, Patent Owner's Preliminary Response for U.S. Pat. No. 9142400, United States Patent and Tradmark Office, Case No. IPR2019-01410, dated Feb. 13, 2020.
"Exhibit 2017", STC.UNM's Responsive Claim Construction Brief in Civil Action No. 6:19-cv-00261-ADA, *Taiwan Semiconductor Manufacturing Co. Ltd* vs. *STC. UNM*, Patent Owner's Preliminary Response for U.S. Pat. No. 9,142,400, United States Patent and Tradmark Office, Case No. IPR2019-01410, dated Feb. 13, 2020.
"Exhibit 2018", Taiwan Semiconductor Manufacturing Co. Limited's and TSMC North America, Inc.'s Reply Claim Construction Brief in Civil Action No. 6:19-cv-00261-ADA, *Taiwan Semiconductor Manufacturing Co. Ltd* vs. *STC. UNM*, Patent Owner's Preliminary Response for U.S. Pat. No. 9,142,400, United States Patent and Tradmark Office, Case No. IPR2019-01410, dated Feb. 13, 2020.
"Exhibit 2019", STC.UNM's Reply Claim Construction Brief in Civil Action No. 6:19-cv-00261-ADA, *Taiwan Semiconductor Manufacturing Co. Ltd* vs. *STC. UNM*, Patent Owner's Preliminary Response for U.S. Pat. No. 9,142,400, United States Patent and Tradmark Office, Case No. IPR2019-01410, dated Feb. 13, 2020.
"Exhibit 2020", Declaration of Anthony J. Lochtefeld, Ph.D., *Taiwan Semiconductor Manufacturing Co. Ltd* vs. *STC. UNM*, Patent Owner's Preliminary Response for U.S. Pat. No. 9,142,400, United States Patent and Trademark Office, Case No. IPR2019-01410, dated Feb. 13, 2020, (36 Pages).
"Exhibit 2021", Letter from Taiwan Semiconductor Manufacturing Company to STC.UNM dated Jan. 15, 2020, *Taiwan Semiconductor Manufacturing Co. Ltd* vs. *STC. UNM*, Patent Owner's Preliminary Response for U.S. Pat. No. 9,142,400, United States Patent and Tradmark Office, Case No. IPR2019-01410, dated Feb. 13, 2020.
"Exhibit 2022", Order Governing Proceedings in Civil Action No. 6:19-cv-00261-ADA, *Taiwan Semiconductor Manufacturing Co. Ltd* vs. *STC. UNM*, Patent Owner's Preliminary Response for U.S. Pat. No. 9,142,400, United States Patent and Tradmark Office, Case No. IPR2019-01410, dated Feb. 13, 2020.
"Exhibit 2023", Taiwan Semiconductor Manufacturing Co. Limited's and TSMC North America, Inc.'s Invalidity Contentions Cover Pleadings in Civil Action No. 6:19-cv-00261-ADA, *Taiwan Semiconductor Manufacturing Co. Ltd* vs. *STC. UNM*, Patent Owner's Preliminary Response for U.S. Pat. No. 9,142,400, United States Patent and Tradmark Office, Case No. IPR2019-01410, dated Feb. 13, 2020.
"Exhibit 2024", Taiwan Semiconductor Manufacturing Co. Limited's and TSMC North America, Inc.'s Exhibit A to Invalidity Contentions in Civil Action No. 6:19-cv-00261-ADA, *Taiwan Semiconductor Manufacturing Co. Ltd* vs. *STC. UNM*, Patent Owner's Preliminary Response for U.S. Pat. No. 9,142,400, United States Patent and Tradmark Office, Case No. IPR2019-01410, dated Feb. 13, 2020.
"Exhibit 2025", Taiwan Semiconductor Manufacturing Co. Limited's and TSMC North America, Inc.'s Exhibit C to Invalidity Contentions in Civil Action No. 6:19-cv-00261-ADA, *Taiwan Semiconductor Manufacturing Co. Ltd* vs. *STC. UNM*, Patent Owner's Preliminary Response for U.S. Pat. No. 9,142,400, United States Patent and Tradmark Office, Case No. IPR2019-01410, dated Feb. 13, 2020.
"Exhibit 2026", Press Release, Mark Bohr and Kaizad Mistry, Intel Corp. (2011) Intel's Revolutionary 22 nm Transistor Technology, May 2, 2011. Available at: https://newsroom.intel.com/press-kits/intel-22nm-3-d-tri- gate-transistor-technology/#gs.wap6u0, *Taiwan Semiconductor Manufacturing Co. Ltd* vs. *STC. UNM*, Patent Owner's Preliminary Response for U.S. Pat. No. 9,142,400, United States Patent and Trademark Office, Case No. IPR2019-01410, dated Feb. 13, 2020.
"Exhibit 2027", Jan et al., "A 22nm SoC platform technology featuring 3-D tri-gate and high-k/metal gate, optimized for ultra low power, high performance and high density SoC applications," 2012 International Electron Devices Meeting, San Francisco, CA, 2012, pp. 3.1.1-3.1.4. doi: 10.1109/IEDM.2012.6478969, *Taiwan Semi-*

(56) References Cited

OTHER PUBLICATIONS conductor Manufacturing Co. Ltd vs. STC. UNM, Patent Owner's Preliminary Response for U.S. Pat. No. 9,142,400, United States Patent and Trademark Office, Case No. IPR2019-01410, dated Feb. 13, 2020.
"Exhibit 2028", Ben Streetman and Sanjay Banerjee, Solid State Electronic Devices (5th Edition), Prentice Hall, New Jersey, 1999, *Taiwan Semiconductor Manufacturing Co. Ltd vs. STC. UNM*, Patent Owner's Preliminary Response for U.S. Pat. No. 9,142,400, United States Patent and Trademark Office, Case No. IPR2019-01410, dated Feb. 13, 2020.
"Exhibit 2029", "Declaration of Harlan Rusty Harris", Ph.D., *Taiwan Semiconductor Manufacturing Co. Ltd vs. STC. UNM*, Patent Owner's Preliminary Response for U.S. Pat. No. 9,142,400, United States Patent and Tradmark Office, Case No. IPR2019-01410, dated Feb. 13, 2020, (79 Pages).
*Taiwan Semiconductor Manufacturing Co. Ltd vs. STC. UNM*, Patent Owner's Preliminary Response for U.S. Pat. No. 9,142,400, United States Patent and Trademark Office, Case No. IPR2019-01410, dated Feb. 13, 2020, (76 Pages).
Paper No. 1003, "Declaration of Dr. Bin Yu", *Taiwan Semiconductor Manufacturing Company Ltd* vs. *STC. UNM*, Inter Partes Review against U.S. Pat. No. 9,142,400, United States Patent and Tradmark Office, Case No. IPR2019-01410, Judge Jean R. Homere, Aug. 2, 2019, (130 Pages).
Paper No. 1007, "S. M. Sze, VLSI Technology (1988)", *Taiwan Semiconductor Manufacturing Company Ltd* vs. *STC. UNM*, Inter Partes Review against U.S. Pat. No. 9,142,400, United States Patent and Trademark Office, Case No. IPR2019-01410, Judge Jean R. Homere, Aug. 2, 2019, (53 Pages).
Paper No. 1008, "Matsunaga", *Taiwan Semiconductor Manufacturing Company Ltd* vs. *STC. UNM*, Inter Partes Review against U.S. Pat. No. 9,142,400, United States Patent and Tradmark Office, Case No. IPR2019-01410, Judge Jean R. Homere, Aug. 2, 2019, (16 Pages).
Paper No. 1009, "Vanamu", *Taiwan Semiconductor Manufacturing Company Ltd* vs. *STC. UNM*, Inter Partes Review against U.S. Pat. No. 9,142,400, United States Patent and Tradmark Office, Case No. IPR2019-01410, Judge Jean R. Homere, Aug. 2, 2019, (13 Pages).
Paper No. 1010, "Nguyen", *Taiwan Semiconductor Manufacturing Company Ltd* vs. *STC. UNM*, Inter Partes Review against U.S. Pat. No. 9,142,400, United States Patent and Tradmark Office, Case No. IPR2019-01410, Judge Jean R. Homere, Aug. 2, 2019, (1 Page).
Paper No. 1012, "Langdo", *Taiwan Semiconductor Manufacturing Company Ltd* vs. *STC. UNM*, Inter Partes Review against U.S. Pat. No. 9,142,400, United States Patent and Tradmark Office, Case No. IPR2019-01410, Judge Jean R. Homere, Aug. 2, 2019, (6 Pages).
Paper No. 1014, "Verheyen", *Taiwan Semiconductor Manufacturing Company Ltd* vs. *STC. UNM*, Inter Partes Review against U.S. Pat. No. 9,142,400, United States Patent and Tradmark Office, Case No. IPR2019-01410, Judge Jean R. Homere, Aug. 2, 2019, (15 Pages).
Paper No. 1015, "Huang", *Taiwan Semiconductor Manufacturing Company Ltd* vs. *STC. UNM*, Inter Partes Review against U.S. Pat. No. 9,142,400, United States Patent and Tradmark Office, Case No. IPR2019-01410, Judge Jean R. Homere, Aug. 2, 2019, (10 Pages).
Paper No. 1016, "Hisamoto", *Taiwan Semiconductor Manufacturing Company Ltd* vs. *STC. UNM*, Inter Partes Review against U.S. Pat. No. 9,142,400, United States Patent and Tradmark Office, Case No. IPR2019-01410, Judge Jean R. Homere, Aug. 2, 2019, (9 Pages).
Paper No. 1017, "Plummer", *Taiwan Semiconductor Manufacturing Company Ltd* vs. *STC. UNM*, Inter Partes Review against U.S. Pat. No. 9,142,400, United States Patent and Tradmark Office, Case No. IPR2019-01410, Judge Jean R. Homere, Aug. 2, 2019, (14 Pages).
Paper No. 1019, "Wang", *Taiwan Semiconductor Manufacturing Company Ltd* vs. *STC. UNM*, Inter Partes Review against U.S. Pat. No. 9,142,400, United States Patent and Tradmark Office, Case No. IPR2019-01410, Judge Jean R. Homere, Aug. 2, 2019, (19 Pages).
Paper No. 1023, "Neamen", *Taiwan Semiconductor Manufacturing Company Ltd* vs. *STC. UNM*, Inter Partes Review against U.S. Pat. No. 9,142,400, United States Patent and Trademark Office, Case No. IPR2019-01410, Judge Jean R. Homere, Aug. 2, 2019, (209 Pages).
Paper No. 1027, "Kilchytska", *Taiwan Semiconductor Manufacturing Company Ltd* vs. *STC. UNM*, Inter Partes Review against U.S. Pat. No. 9,142,400, United States Patent and Trademark Office, Case No. IPR2019-01410, Judge Jean R. Homere, Aug. 2, 2019, (4 Pages).
Paper No. 1028, "Chenming Hu", *Taiwan Semiconductor Manufacturing Company Ltd* vs. *STC. UNM*, Inter Partes Review against U.S. Pat. No. 9,142,400, United States Patent and Trademark Office, Case No. IPR2019-01410, Judge Jean R. Homere, Aug. 2, 2019, (42 Pages).
Paper No. 1029, "Declaration of Dr. Sylvia Hall-Ellis", *Taiwan Semiconductor Manufacturing Company Ltd* vs. *STC. UNM*, Inter Partes Review against U.S. Pat. No. 9,142,400, United States Patent and Trademark Office, Case No. IPR2019-01410, Judge Jean R. Homere, Aug. 2, 2019, (306 Pages).
Paper No. 3, "Petition for Inter Partes Review of U.S. Pat. No. 9,142,400", *Taiwan Semiconductor Manufacturing Company Ltd* vs. *STC. UNM*, Inter Partes Review against U.S. Pat. No. 9,142,400, United States Patent and Trademark Office, Case No. IPR2019-01410, Judge Jean R. Homere, Aug. 2, 2019, (95 Pages).
Paper No. 1002, "Exhibit 1002—Subramanian declaration", *Samsung Electronics Co., Ltd* vs. *STC. UNM*, Inter Partes Review against U.S. Pat. No. 9,142,400, United States Patent and Trademark Office, Case No. IPR2020-00009, Oct. 4, 2019, (190 Pages).
Paper No. 1008, "Exhibit 1008—Plummer—Silicon VLSI Technology", *Samsung Electronics Co., Ltd* vs. *STC. UNM*, Inter Partes Review against U.S. Pat. No. 9,142,400, United States Patent and Trademark Office, Case No. IPR2020-00009, Oct. 4,2019, (45 Pages).
Paper No. 1009, "Exhibit 1009—FH 61672713 (provisional)", *Samsung Electronics Co., Ltd* vs. *STC. UNM*, Inter Partes Review against U.S. Pat. No. 9,142,400, United States Patent and Trademark Office, Case No. IPR2020-00009, Oct. 4, 2019, (23 Pages).
Paper No. 1010, "Exhibit 1010—Zubia et al.—Nanoheteroepitaxy the application . . . —J Appl Phys—(1999)—85—6492-6496", *Samsung Electronics Co., Ltd* vs. *STC. UNM*, Inter Partes Review against U.S. Pat. No. 9,142,400, United States Patent and Trademark Office, Case No. IPR2020-00009, Oct. 4, 2019, (5 Pages).
Paper No. 1013, "Exhibit 1013—Thompson", *Samsung Electronics Co., Ltd* vs. *STC. UNM*, Inter Partes Review against U.S. Pat. No. 9,142,400, United States Patent and Trademark Office, Case No. IPR2020-00009, Oct. 4, 2019, (8 Pages).
Paper No. 1015, "Exhibit 1015—Sah—Fundamentals of Solid-State Electronics_Part1", *Samsung Electronics Co., Ltd* vs. *STC. UNM*, Inter Partes Review against U.S. Pat. No. 9,142,400, United States Patent and Trademark Office, Case No. IPR2020-00009, Oct. 4, 2019, (54 Pages).
Paper No. 1015, "Exhibit 1015—Sah—Fundamentals of Solid-State Electronics_Part2", *Samsung Electronics Co., Ltd* vs. *STC. UNM*, Inter Partes Review against U.S. Pat. No. 9,142,400, United States Patent and Trademark Office, Case No. IPR2020-00009, Oct. 4, 2019, (49 Pages).
Paper No. 1016, "Exhibit 1016—Tang et al.—FinFET—a quasi-planar . . . —IEEE ISSCC Digest Tech Papers—(2001)", *Samsung Electronics Co., Ltd* vs. *STC. UNM*, Inter Partes Review against U.S. Pat. No. 9,142,400, United States Patent and Trademark Office, Case No. IPR2020-00009, Oct. 4, 2019, (3 Pages).
Paper No. 1018, "Exhibit 1018—Dadgar—Epitaxy of GaN on silicon-impact of symmetry and surface reconstruction", *Samsung Electronics Co., Ltd* vs. *STC. UNM*, Inter Partes Review against U.S. Pat. No. 9,142,400, United States Patent and Trademark Office, Case No. IPR2020-00009, Oct. 4, 2019, (10 Pages).
Paper No. 1020, "Exhibit 1020—Streetman", *Samsung Electronics Co., Ltd* vs. *STC. UNM*, Inter Partes Review against U.S. Pat. No. 9,142,400, United States Patent and Tradmark Office, Case No. IPR2020-00009, Oct. 4, 2019, (20 Pages).
Paper No. 1021, "Exhibit 1021—Van Zant", *Samsung Electronics Co., Ltd* vs. *STC. UNM*, Inter Partes Review against U.S. Pat. No. 9,142,400, United States Patent and Tradmark Office, Case No. IPR2020-00009, Oct. 4, 2019, (44 Pages).

(56) References Cited

OTHER PUBLICATIONS

Paper No. 1022, "Exhibit 1022—Baker—CMOS Circuit Design, Layout, and Simulation—chapter 7 (excerpt)", *Samsung Electronics Co., Ltd* vs. *STC. UNM*, Inter Partes Review against U.S. Pat. No. 9,142,400, United States Patent and Trademark Office, Case No. IPR2020-00009, Oct. 4, 2019, (31 Pages).
Paper No. 1026, "Exhibit 1026—Ginsberg et al.—Selective epitaxial growth . . . —IBM J Res Develop—(1990)—34—816", *Samsung Electronics Co., Ltd* vs. *STC. UNM*, Inter Partes Review against U.S. Pat. No. 9,142,400, United States Patent and Tradmark Office, Case No. IPR2020-00009, Oct. 4, 2019, (12 Pages).
Paper No. 1027, "Exhibit 1027—Goulding—The Selective Epitaxial Growth of Silicon 1991", *Samsung Electronics Co., Ltd* vs. *STC. UNM*, Inter Partes Review against U.S. Pat. No. 9,142,400, United States Patent and Trademark Office, Case No. IPR2020-00009, Oct. 4, 2019, (35 Pages).
Paper No. 1028, "Exhibit 1028—Bestwick—Reactive ion etching of silcion using bromine containing plasmas 1990", *Samsung Electronics Co., Ltd* vs. *STC. UNM*, Inter Partes Review against U.S. Pat. No. 9,142,400, United States Patent and Tradmark Office, Case No. IPR2020-00009, Oct. 4, 2019, (6 Pages).
Paper No. 1, "Petition for Inter Partes Review of U.S. Pat. No. 9,142,400", *Samsung Electronics Co., Ltd* vs. *STC. JNM*, Inter Partes Review against U.S. Pat. No. 9,142,400, United States Patent and Tradmark Office, Case No. IPR2020-00009, Oct. 4, 2019, (108 Pages).
"Appendix A1_Yu '889 applied to '400 Patent", *Samsung Electronics Co., Ltd* vs. *STC. UNM*, Defendant's Preliminary Invalidity Contentions and Additional Disclosures Pursuant to Order Governing Proceedings against U.S. Pat. No. 9,142,400, in the United States District Court for the Western District of Texas Austin Division, Case No. 6:19-cv-329-ADA, Nov. 1, 2019, (14 Pages).
"Appendix A2_Wu '770 applied to '400 Patent", *Samsung Electronics Co., Ltd* vs. *STC. UNM*, Defendant's Preliminary Invalidity Contentions and Additional Disclosures Pursuant to Order Governing Proceedings against U.S. Pat. No. 9,142,400, in the United States District Court for the Western District of Texas Austin Division, Case No. 6:19-cv-329-ADA, Nov. 1, 2019, (29 Pages).
"Appendix A3_Yu '271 applied to '400 Patent", *Samsung Electronics Co., Ltd* vs. *STC. UNM*, Defendant'S Preliminary Invalidity Contentions and Additional Disclosures Pursuant to Order Governing Proceedings against U.S. Pat. No. 9,142,400, in the United States District Court for the Western District of Texas Austin Division, Case No. 6:19-cv-329-ADA, Nov. 1, 2019, (22 Pages).
"Appendix A4_Lin '517 applied to '400 Patent", *Samsung Electronics Co., Ltd* vs. *STC. UNM*, Defendant's Preliminary Invalidity Contentions and Additional Disclosures Pursuant to Order Governing Proceedings against U.S. Pat. No. 9,142,400, in the United States District Court for the Western District of Texas Austin Division, Case No. 6:19-cv-329-ADA, Nov. 1, 2019, (30 Pages).
"Appendix A5_Lochtefeld '592 applied to '400 Patent", *Samsung Electronics Co., Ltd* vs. *STC. UNM*, Defendant'S Preliminary Invalidity Contentions and Additional Disclosures Pursuant to Order Governing Proceedings against U.S. Pat. No. 9,142,400, in the United States District Court for the Western District of Texas Austin Division, Case No. 6:19-cv-329-ADA, Nov. 1, 2019, (29 Pages).
"Appendix A6_Giles '987 applied to '400 Patent", *Samsung Electronics Co., Ltd* vs. *STC. UNM*, Defendant's Preliminary Invalidity Contentions and Additional Disclosures Pursuant to Order Governing Proceedings against U.S. Pat. No. 9,142,400, in the United States District Court for the Western District of Texas Austin Division, Case No. 6:19-cv-329-ADA, Nov. 1, 2019, (24 Pages).
"Appendix A7_Chen '353 applied to '400 Patent", *Samsung Electronics Co., Ltd* vs. *STC. UNM*, Defendant's Preliminary Invalidity Contentions and Additional Disclosures Pursuant to Order Governing Proceedings against U.S. Pat. No. 9,142,400, in the United States District Court for the Western District of Texas Austin Division, Case No. 6:19-cv-329-ADA, Nov. 1, 2019, (26 Pages).
"Appendix A8_Tang '825 applied to '400 Patent", *Samsung Electronics Co., Ltd* vs. *STC. UNM*, Defendant's Preliminary Invalidity Contentions and Additional Disclosures Pursuant to Order Governing Proceedings against U.S. Pat. No. 9,142,400, in the United States District Court for the Western District of Texas Austin Division, Case No. 6:19-cv-329-ADA, Nov. 1, 2019, (24 Pages).
"Petition for Inter Partes Review of U.S. Pat. No. 9,142,400", *Samsung Electronics Co., Ltd* vs. *STC. UNM*, Defendant'S Preliminary Invalidity Contentions and Additional Disclosures Pursuant to Order Governing Proceedings against U.S. Pat. No. 9,142,400, in the United States District Court for the Western District of Texas Austin Division, Case No. 6:19-cv-329-ADA, Nov. 1, 2019, (34 Pages).
"Defendants Taiwan Semiconductor Manufacturing Corporation Limited and TSMC North America's Preliminary Invalidity Contentions", *STC.* vs. *Taiwan Semiconductor Manufacturing Company Limited and TSMC North America, Inc.*, in the United States District Court for the Western District of Texas Waco Division, Case No. 6:19-cv-261-ADA (W.D. Tex.), Nov. 1, 2019, (206 Pages).
"Exhibit A—U.S. Pat. No. 7,799,592 (Lochtefeld)", *STC.* vs. *Taiwan Semiconductor Manufacturing Company Limited and TSMC North America, Inc.*, in the United States District Court for the Western District of Texas Waco Division, Case No. 6:19-cv-261-ADA (W.D. Tex.), Nov. 1, 2019, (50 Pages).
"Exhibit AA—U.S. Pat. No. 8,912,603 (Luning)", *STC.* vs. *Taiwan Semiconductor Manufacturing Company Limited and TSMC North America, Inc.*, in the United States District Court for the Western District of Texas Waco Division, Case No. 6:19-cv-261-ADA (W.D. Tex.), Nov. 1, 2019, (61 Pages).
"Exhibit B—US2011_0097881 (Vandervorst)", *STC.* vs. *Taiwan Semiconductor Manufacturing Company Limited and TSMC North America, Inc.*, in the United States District Court for the Western District of Texas Waco Division, Case No. 6:19-cv-261-ADA (W.D. Tex.), Nov. 1, 2019, (50 Pages).
"Exhibit C—U.S. Pat. No. 7,939,889 (Yu_889)", *STC.* vs. *Taiwan Semiconductor Manufacturing Company Limited and TSMC North America, Inc.*, in the United States District Court for the Western District of Texas Waco Division, Case No. 6:19-cv-261-ADA (W.D. Tex.), Nov. 1, 2019, (23 Pages).
"Exhibit CC—Secondary References Omibus Chart", *STC.* vs. *Taiwan Semiconductor Manufacturing Company Limited and TSMC North America, Inc.*, in the United States District Court for the Western District of Texas Waco Division, Case No. 6:19-cv-261-ADA (W.D. Tex.), Nov. 1, 2019, (529 Pages).
"Exhibit D—U.S. Pat. No. 9166022 (Xu_022)", *STC.* vs. *Taiwan Semiconductor Manufacturing Company Limited and TSMC North America, Inc.*, in the United States District Court for the Western District of Texas Waco Division, Case No. 6:19-cv-261-ADA (W.D. Tex.), Nov. 1, 2019, (68 Pages).
"Exhibit DD—Aug. 2, 2019 Petition for Inter Partes Review of U.S. Pat. No. 9,142,400", *STC.* vs. *Taiwan Semiconductor Manufacturing Company Limited and TSMC North America, Inc.*, in the United States District Court for the Western District of Texas Waco Division, Case No. 6:19-cv-261-ADA (W.D. Tex.), Nov. 1, 2019, (95 Pages).
"Exhibit E—U.S. Pat. No. 7,176,067 (Jung)", *STC.* vs. *Taiwan Semiconductor Manufacturing Company Limited and TSMC North America, Inc.*, in the United States District Court for the Western District of Texas Waco Division, Case No. 6:19-cv-261-ADA (W.D. Tex.), Nov. 1, 2019, (20 Pages).
"Intel 22nm 3-D Tri-Gate Transistor Technology", Intel Newsroom, May 2, 2011.
"Intel Reinvents Transistors Using New 3-D Structure", Intel Newsroom, May 4, 2011.
Specification sheet for Intel® Xeon® Processor E3-1230 v2.
Intel Ivy Bridge Processor Image, TSMC-STC-00003083-3083.
Intel Ivy Bridge Processor Image, TSMC-STC-00003083-3084.
Intel Ivy Bridge Processor Image, TSMC-STC-00003083-3085.
Intel Ivy Bridge Processor Image, TSMC-STC-00003083-3086.
Intel Ivy Bridge Processor Image, TSMC-STC-00003083-3087.
Intel Ivy Bridge Processor Image, TSMC-STC-00003083-3088.
Intel Ivy Bridge Processor Image, TSMC-STC-00003083-3089.
Intel Ivy Bridge Processor Image, TSMC-STC-00003083-3090.

(56) References Cited

OTHER PUBLICATIONS

Sangwoo et al., "Multiple Layers of Silicon-on-Insulator Islands Fabrication by Selective Epitaxial Growth", IEEE Electron Device Letters, vol. 20, No. 5, May 1999.
Reddy et al., "Lattice-matched AI 0.95Ga0.05AsSb oxide for current confinement in InP-based long wavelength VCSELs", Journal of Crystal Growth 251 (2003)766-770, 2003.
Rahman A. et al., "Novel channel materials for ballistic nanoscale MOSFETs-bandstructure effects", IEDM, 2005, pp. 1-4.
Datta S. et al., "85nm Gate Length Enhancement and Depletion mode InSb Quantum Well Transistors for Ultra High Speed and Very Low Power Digital Logic Applications", IEDM, 2005, pp. 1-4.
Iwai H., "Recent Status on Nano CMOS and Future Direction" Int. Conf. on Nano-CMOS, IEEE, 2006, pp. 1-5.
Brammertz, G. et al. "Selective epitaxial growth of GaAs on Ge by MOCVD", Journal of Crystal Growth, vol. 297, 2006, pp. 204-210.
Datta S. "Ultrahigh-Speed 0.5 V Supply Voltage In0.7Ga0.3As Quantum-Well Transistors on Silicon Substrate", IEEE Electron Device Letters, vol. 28, No. 8, Aug. 2007, pp. 685-687.
Do, Q.-T. et al., "High Transconductance MISFET with a Single InAs Nanowire Channel", IEEE Electron Device Letters, vol. 28, No. 8, Aug. 2007, pp. 682-684.
Ashley T. et al., "Heterogeneous InSb quantum well transistors on silicon for ultra-high speed, low power logic applications", Electronics Letters, vol. 43, No. 14, Jul. 5, 2007, 2 Pages.
Bourianoff, G. I. et al., "Research directions in beyond CMOS computing", Solid-Slate Electronics, vol. 51, 2007, pp. 1426-1431.
Hu Y. et al., "Sub-100 Nanometer Channel Length Ge/Si Nanowire Transistors with Potential for 2 THz Switching Speed", Nano Letters, vol. 8, No. 3, 2008, pp. 925-930.
Antoniadis D. A. et al., "MOSFET Performance Scaling: Limitations and Future Options", IEDM, 2008, 4 Pages.
Verhulst, A. S. et al., "Complementary Silicon-Based Heterostructure Tunnel-FETs With High Tunnel Rates", IEEE Electron Device Letters, vol. 29, 2008, pp. 1-4.
Mookerjea, S. et al., "Comparative Study of Si, Ge and InAs based Steep SubThreshold Slope Tunnel Transistors for 0.25V Supply Voltage Logic Applications", Proc. DRC, 2008, 2 Pages.
Wu, Y. Q. et al., "0.8-V Supply Voltage Deep-Submicrometer Inversion-Mode In0.75Ga0.25As MOSFET", IEEE Electron Device Letters, vol. 30, No. 7, Jul. 2009, pp. 700-702.
Doornbos, G. et al., "Benchmarking of III-V n-MOSFET Maturity and Feasibility for Future CMOS", IEEE Electron Device Letters, vol. 31, No. 10, Oct. 2010, pp. 1110-1112.
Lubow A. et al., "Comparison of drive currents in metal-oxide-semiconductor field-effect transistors made of Si, Ge, GaAs, InGaAs, and InAs channels", Applied Physics Letters, vol. 96, 2010, pp. 122105/1-122105/3.
Moutanabbir O. et al., "Heterogeneous Integration of Compound Semiconductors", Annu. Rev. Mater. Res., vol. 40, 2010, pp. 469-500.
Wang G. et al., "Fabrication of high quality Ge virtual substrates by selective epitaxial growth in shallow trench isolated Si (001) trenches", Thin Solid Films, vol. 518, 2010, pp. 2538-2541.
Keshavarzi, A. et al., "Architecting Advanced Technologies for 14nm and Beyond with 3D FinFET Transistors for the Future SoC Applications", Proc IEDM, 2011, pp. 4.1.1-4.1 4.
Ali A. et al., "Advanced Composite High-K Gate Stack for mixed Anion Arsenide-Antimonide Quantum Well Transistors", Proc. IEDM, 2010, 5 Pages.
Bessire C. D. et al., "Trap-Assisted Tunneling in Si-InAs Nanowire Heterojunction Tunnel Diodes", Nano Letters, vol. 11, 2011, pp. A-E.
Heyns M. et al., "Advancing CMOS beyond the Si roadmap with Ge and III/V devices", Proc IEDM, 2011, pp. 13.1.1-13.1.4.
Kim S-H. et al., "Electron Mobility Enhancement of Extremely Thin Body In0:7Ga0:3As-on-Insulator Metal-Oxide-Semiconductor Field-Effect Transistors on Si Substrates by Metal-Oxide-Semiconductor Interface Buffer Layers", Applied Physics Express, vol. 5, 2012, pp. 014201/1-014201/3.
Tomioka K. et al., "A III-V nanowire channel on silicon for high-performance vertical transistors", Nature Aug. 9, 2012, vol. 488, pp. 189-193.
Takei K. et al., "Nanoscale InGaSb Heterostructure Membranes on Si Substrates for High Hole Mobility Transistors", Nano Letters, vol. 12, 2012, pp. 2060-2066.
Hwang E. et al., "Investigation of scalability of In0.7Ga0.3As quantum well field effect transistor (QWFET) architecture for logic applications", Solid-Slate Electronics, 2011, pp. 1-8.
Long Wei et al., "Dual-Material Gate (DMG) Field Effect Transistor", IEEE Transactions on Electron Devices, vol. 46, No. 5, May 1999, pp. 865-870.
Larrieu, G. et al., "Vertical nanowire array-based field effect transistors for ultimate scaling", Nanoscale 5, 2013, pp. 2437-2441.
Brammertz, G. et al., "GaAs on Ge for CMOS", Thin Solid Films, 2008(517):148-151.
Hsu, Chao-Wei et al. "Dislocation reduction of InAs nanofins prepared on Si substrate using metal-organic vapor-phase epitaxy", Nanoscale Research Letters 7, Nov. 23, 2012.
Dutta et al., "Novel properties of graphene nanoribbons: A review", J. Mater. Chem., vol. 20, Oct. 2010.
Bestwick, et al., "Reactive ion etching of silicon using bromine containing plasmas", Journal Vacuum Soc. Tech., May/Jun. 1990.
Dadgar, et al., "Epitaxy of GaN on silicon-impact of symmetry and surface reconstruction", New Journal of Physics, 2007.
Ginsberg, et al., "Selective epitaxial growth of silicon and some potential applications", Journal of Research Development, vol. 34, No. 6, Nov. 1990.
Tang, et al., "7.4 FinFET—A Quasi-Planar Double-Gate MOSFET", IEEE Int'l Solid-State Circuits Conf., 2001.
Stanley Wolf et al., "Silicon Processing for the VLSI Era", vol. 1, Lattice Press, Reprinted with Corrections, Jun. 1987.
Safa Kasap et al., "Springer Handbook of Electronic and Photonic Materials", Springer Handbooks, 2006.
Leland Chang et al., "CMOS Circuit Performance Enhancement by Surface Orientation Optimization", IEEE Transactions on Electron Devices, vol. 51, No. 10, Oct. 2004.
Quirk et al., "Semiconductor Manufacturing Technology", Prentice Hall, 2001.
Sverdlov, "Strain-Induced Effects in Advanced MOSFETs", 1st Edition, Springer Wien, New York, 2011.
Mark et al., Intel's Revolutionary 22 nm Transistor Technology, Intel Corp., May 2, 2011.
Jan et al., "A 22nm SoC platform technology featuring 3-D tri-gate and high-k/metal gate, optimized for ultra low power, high performance and high density SoC applications," 2012 International Electron Devices Meeting, San Francisco, DA, 2012, pp. 3.1.1-3.1.4.
Ben et al., Solid State Electronic Devices (5th Edition), Prentice Hall, New Jersey, 1999.
Transcript of Telephonic Hearing in *Taiwan Semiconductor Manufacturing Co. Ltd v. STC.UNM*, Case No. IPR2019-01410, Oct. 7, 2019.
Chang et al., "Electrical characteristics dependence on the channel fin aspect ratio of multi-fin field effect transistors," Semiconductor Science and Technology 24, 2009.
Ho et al., "Design Optimization of Multigate Bulk MOSFETs," IEEE Transactions on Electron Devices, vol. 60, No. 1, Jan. 2013.
Cambridge Online Dictionary, definition "pedestal," available at https://dictionary.cambridge.org/us/dictionary/english/pedestal, last accessed Feb. 11, 2020.
Saitoh et al., "Short-Channel Performance Improvement by Raised Source/Drain Extensions With Thin Spacers in Trigate Silicon Nanowire MOSFETs", IEEE Electron Device Letters, vol. 32, No. 3, Mar. 2011.
Madayag et al., "Optimization of Spin-On-Glass Process for Multilevel Metal Interconnects", IEEE Proceedings of the Fourteenth Biennial University/Government/ Industry Microelectronics Symposium, Aug. 7, 2002.
Mark Bohr & Kaizad Mistry, "Intel's Revolutionary 22 nm Transistor Technology", May 2011.

(56) References Cited

OTHER PUBLICATIONS

R. de Andrade Costa et al., "Microfabricated porous glass channels for electrokinetic separation devices", Lab on a Chip, vol. 5, Dec. 2005.
Chenming Hu, "Modern Semiconductor Devices for Integrated Circuits", 1st ed., Pearson, 2009.
J.-P. Colinge, "FinFETs and Other Multi-Gate Transistors", Springer Science & Business Media, 2008.
J.M. Hartmann et al., "Growth kinetics of Si and SiGe on Si(100), Si(110) and Si(111) surfaces", Elsevier Journal of Crystal Growth, vol. 294, 2006.
Eneman, "Short-channel epitaxial germanium pMOS transistors", Elsevier Thin Solid Films, vol. 518, Oct. 19, 2009.
Hydrick, "Chemical Mechanical Polishing of Epitaxial Germanium on SiO2-patterned Si(001) Substrates", ECS Transactions, vol. 16, 2008.
Neudeck, "Novel Silicon Epitaxy for Advanced MOSFET Devices", IEEE, Technical Digest—IEDM, 2000.
Park, "Defect Reduction and Its Mechanism of Selective Ge Epitaxy in Trenches on Si(001) Substrates using Aspect Ratio Trapping", Materials Research Society Proceedings, vol. 994, 2007.
Park, "Fabrication of Low-Defectivity, Compressively Strained Ge on Si0.2Ge0.8 Structures Using Aspect Ratio Trapping", Journal of the Electrochemical Society, vol. 156, Feb. 4, 2009.
Drowley, "Model for facet and sidewall defect formation during selective epitaxial growth of (001) silicon", Applied Physics Letters, vol. 52, 1988.
Gosset, "General review of issues and perspectives for advanced copper interconnections using air gap as ultra-low K material", IEEE, 2003.
Kahng, "Fill for Shallow Trench Isolation CMP", ICCAD, 2006.
King, "Advanced Materials and Processes for Nanomater-Scale FinFETs", The International Electron Devices and Materials Symposia, 2002.
Lee, "Growth of GaN on a nanoscale periodic faceted Si substrate by metal organic vapor phase epitaxy", IEEE, 2004.
Li, "Heteroepitaxy of High-quality Ge on Si by Nanoscale Ge Seeds Grown through a Thin Layer of SiO2", Applied Physics Letters, vol. 85, Sep. 17, 2004.
Li, "Defect Reduction of GaAs Epitaxy on Si (001) Using Selective Aspect Ratio Trapping", Applied Physics Letters, vol. 91, Jul. 13, 2007.
Li, "Selective Growth of Ge on Si(100) through vias of SiO2 Nanotemplate Using Solid Source Molecular Beam Epitaxy", Applied Physics Letters, vol. 83, Dec. 10, 2003.
Liang, "Critical Thickness Enhancement of Epitaxial SiGe films Grown on Small Structures", Applied Physics Letters, vol. 97, Jan. 25, 2005.
Lim, "Facet Evolution in Selective Epitaxial Growth of Si by Cold-wall Ultrahigh Vacuum Chemical Vapor Deposition", Jounral of Vacuum Science & Technology B: Microelectronics and Nanometer Structures Processing, Measurement, and Phenomena, vol. 22, Mar. 11, 2004.
Liu, "High Quality Single-crystal Ge on Insulator by Liquid-phase Epitaxy on Si Substrates", Applied Physics Letters, vol. 84, Apr. 1, 2004.
Liu, "Rapid Melt Growth of Germanium Crystals with Self-Aligned Microcrucibles on Si Substrates", Journal of the Electrochemical Society, vol. 152, Jul. 14, 2005.
Loo, "Successful Selective Epitaxial Si1 -xGex Deposition Process for HBT-BiCMOS and High Mobility Heterojunction pMOS Applications", Journal of the Electrochemical Society, vol. 150, Aug. 18, 2003.
Luan, "High-quality Ge Epilayers on Si with Low Threading-dislocation Densities", Applied Physics Letters, vol. 75, Nov. 3, 1999.
Lubnow, "Effect of III/V-Compound Epitaxy on Si Metal Oxide-Semiconductor Circuits", Japanese Journal of Applied Physics, 1994.

Nakano, "Epitaxial lateral overgrowth of AlN layers on patterned sapphire substrates", Physica Status Solidi, vol. 203, May 22, 2006.
Nam, "Lateral Epitaxy of Low Defect Density GaN Layers via Organometallic Vapor Phase Epitaxy", Applied Physics Letters, vol. 71, Jun. 4, 1998.
Naoi, "Epitaxial lateral overgrowth of GaN on selected-area Si(1 1 1) substrate with nitrided Si mask", Journal of Crystal Growth, 2003.
Norman, "Characterization of MOCVD lateral epitaxial overgrown III-V semiconductor layers on GaAs substrates", IEEE, 2003.
Parillaud, "High quality InP on Si by conformal growth", Applied Physics Letters, vol. 68, Jun. 4, 1998.
Pribat, "High quality GaAs on Si by conformal growth", Applied Physics Letters, vol. 60 , Jun. 4, 1998.
Ren, "Low-dislocation-density, nonplanar GaN templates for buried heterostructure lasers grown by lateral epitaxial overgrowth", Applied Physics Letters, vol. 86, Mar. 7, 2005.
Sakai, "Defect Structure in Selectively Grown GaN Films with Low Threading Dislocation Density", Applied Physics Letters, vol. 71, Aug. 5, 1998.
Sakai, "Transmission electron microscopy of defects in GaN films formed by epitaxial lateral overgrowth", Applied Physics Letters, vol. 73, Jul. 21, 1998.
Schaub, "Resonant-cavity-enhanced high-speed Si photodiode grown by epitaxial lateral overgrowth", IEEE Photonics Technology Letters, vol. 11, Dec. 12, 1999.
Shahidi, "Fabrication of CMOS on ultrathin SOI obtained by epitaxial lateral overgrowth and chemical-mechanical polishing", IEEE, 1990.
Siekkinen, "Selective epitaxial growth silicon bipolar transistors for material characterization", IEEE Transactions on Electron Devices, vol. 35, Oct. 1988.
Su, "New planar self-aligned double-gate fully-depleted P-MOSFEI s using epitaxial lateral overgrowth (ELO) and selectively grown source/drain (S/D)", IEEE International SOI Conference, Oct. 2000.
Sun "Temporally resolved growth of InP in the openings off-oriented from [110] direction", IEEE, 2000.
Sun, "InGaAsP multi-quantum wells at 1.5 μm wavelength grown on indium phosphide templates on silicon", IEEE, 2003.
Sun, "Sulfur doped indium phosphide on silicon substrate grown by epitaxial lateral overgrowth", 2004 International Conference on Indium Phoshide and Related Materials, 2004.
Sun, "Selective area growth of InP on InP precoated silicon substrate by hydride vapor phase epitaxy", IEEE, 2002.
Suryanarayana, "Microstructure of lateral epitaxial overgrown InAs on (100) GaAs substrates", Applied Physics Letters, vol. 83, Sep. 2, 2003.
Tanaka, "Structural Characterization of GaN Laterally Overgrown on a (111) Si Substrate", Applied Physics Letters, vol. 79, Aug. 13, 2001.
Tsang, "The heteroepitaxial ridge-overgrown distributed feedback laser", IEEE Journal of Quantum Electronics, vol. QE-21, Jun. 1985.
Tsaur, "Low-dislocation-density GaAs epilayers grown on Ge-coated Si Substrates by means of lateral epitaxial overgrowth", Applied Physics Letters, vol. 41, Jun. 4, 1998.
Tsuji, "Selective Epitaxial Growth of GaAs on Si with Strained Sort-period Superlattices by Molecular Beam Epitaxy under Atomic Hydrogen Irradiation", Journal of Vacuum Science & Technology B: Microelectronics and Nanometer Structures Processing, Measurement, and Phenomena, vol. 22, 2004.
Zaidi et al., "High aspect-ratio holographic photoresist gratings", Applied Optics, Jul. 15, 1988, vol. 27, No. 14, 4 pages.
Zubia et al., "Nanoheteroepitaxy: The Application of nanostructuring and substrate compliance to the heteroepitaxy of mismatched semiconductor materials", Journal of Applied Physics, 1999, vol. 74, 6 pages.
Brueck et al., "Optical and Interferometric Lithography—Nanotechnology Enablers", Proceedings of the IEEE, Oct. 2005, vol. 93, No. 10, 18 pages.
"Exhibit F—U.S. Pat. No. 8,742,509 (Lee_509)", *STC.* vs. *Taiwan Semiconductor Manufacturing Company Limited and TSMC North*

(56) References Cited

OTHER PUBLICATIONS

America, Inc., in the United States District Court for the Western District of Texas Waco Division, Case No. 6:19-cv-261-ADA (W.D. Tex.), Nov. 1, 2019, (26 Pages).

"Exhibit G—Verheyen", *STC.* vs. *Taiwan Semiconductor Manufacturing Company Limited and TSMC North America, Inc.*, in the United States District Court for the Western District of Texas Naco Division, Case No. 6:19-cv-261-ADA (W.D. Tex.), Nov. 1, 2019, (19 Pages).

"Exhibit H—U.S. Pat. No. 7,667,271 (Yu_271)", *STC.* vs. *Taiwan Semiconductor Manufacturing Company Limited and TSMC North America, Inc.*, in the United States District Court for the Western District of Texas Waco Division, Case No. 6:19-cv-261-ADA (W.D. Tex.), Nov. 1, 2019, (29 Pages).

"Exhibit J—U.S. Pat. No. 7,582,516 (Dyer)", *STC.* vs. *Taiwan Semiconductor Manufacturing Company Limited and TSMC North America, Inc.*, in the United States District Court for the Western District of Texas Waco Division, Case No. 6:19-cv-261-ADA (W.D. Tex.), Nov. 1, 2019, (44 Pages).

"Exhibit K—US2011_0068407 (Yeh)", *STC.* vs. *Taiwan Semiconductor Manufacturing Company Limited and TSMC North America, Inc.*, in the United States District Court for the Western District of Texas Waco Division, Case No. 6:19-cv-261-ADA (W.D. Tex.), Nov. 1, 2019, (30 Pages).

"Exhibit L—US20110210393 (Chen)", *STC.* vs. *Taiwan Semiconductor Manufacturing Company Limited and TSMC North America, Inc.*, in the United States District Court for the Western District of Texas Waco Division, Case No. 6:19-cv-261-ADA (W.D. Tex.), Nov. 1, 2019, (19 Pages).

"Exhibit M—U.S. Pat. No. 8,264,021 (Lai)", *STC.* vs. *Taiwan Semiconductor Manufacturing Company Limited and TSMC North America, Inc.*, in the United States District Court for the Western District of Texas Waco Division, Case No. 6:19-cv-261-ADA (W.D. Tex.), Nov. 1, 2019, (61 Pages).

"Exhibit N—U.S. Pat. No. 8,680,576 (Ching)", *STC.* vs. *Taiwan Semiconductor Manufacturing Company Limited and TSMC North America, Inc.*, in the United States District Court for the Western District of Texas Waco Division, Case No. 6:19-cv-261-ADA (W.D. Tex.), Nov. 1, 2019, (72 Pages).

"Exhibit O—U.S. Pat. No. 8,753,942 (Kuhn)", *STC.* vs. *Taiwan Semiconductor Manufacturing Company Limited and TSMC North America, Inc.*, in the United States District Court for the Western District of Texas Waco Division, Case No. 6:19-cv-261-ADA (W.D. Tex.), Nov. 1, 2019, (24 Pages).

"Exhibit P—U.S. Pat. No. 8,841,701 (Lin 701)", *STC.* vs. *Taiwan Semiconductor Manufacturing Company Limited and TSMC North America, Inc.*, in the United States District Court for the Western District of Texas Waco Division, Case No. 6:19-cv-261-ADA (W.D. Tex.), Nov. 1, 2019, (59 Pages).

"Exhibit Q—U.S. Pat. No. 9,099,388 (Lin 338)", *STC.* vs. *Taiwan Semiconductor Manufacturing Company Limited and Tsmc North America, Inc.*, in the United States District Court for the Western District of Texas Waco Division, Case No. 6:19-cv-261-ADA (W.D. Tex.), Nov. 1, 2019, (30 Pages).

"Exhibit R—U.S. Pat. No. 8,440,517 (Lin 517)", *STC.* vs. *Taiwan Semiconductor Manufacturing Company Limited and TSMC North America, Inc.*, in the United States District Court for the Western District of Texas Waco Division, Case No. 6:19-cv-261-ADA (W.D. Tex.), Nov. 1, 2019, (60 Pages).

"Exhibit S—US20110073952 (Kwok)", *STC.* vs. *Taiwan Semiconductor Manufacturing Company Limited and Tsmc North America, Inc.*, in the United States District Court for the Western District of Texas Waco Division, Case No. 6:19-cv-261-ADA (W.D. Tex.), Nov. 1, 2019, (16 Pages).

"Exhibit T—US20110147842 (Cappellani)", *STC.* vs. *Taiwan Semiconductor Manufacturing Company Limited and TSMC North America, Inc.*, in the United States District Court for the Western District of Texas Waco Division, Case No. 6:19-cv-261-ADA (W.D. Tex.), Nov. 1, 2019, (24 Pages).

"Exhibit U—US20110201164 (Chung)", *STC.* vs. *Taiwan Semiconductor Manufacturing Company Limited and TSMC North America, Inc.*, in the United States District Court for the Western District of Texas Waco Division, Case No. 6:19-cv-261-ADA (W.D. Tex.), Nov. 1, 2019, (29 Pages).

"Exhibit V—US20120001197 (Liaw)", *STC.* vs. *Taiwan Semiconductor Manufacturing Company Limited and TSMC North America, Inc.*, in the United States District Court for the Western District of Texas Waco Division, Case No. 6:19-cv-261-ADA (W.D. Tex.), Nov. 1, 2019, (59 Pages).

"Exhibit W—U.S. Pat. No. 7,525,160 (Kavalieros)", *STC.* vs. *Taiwan Semiconductor Manufacturing Company Limited and TSMC North America, Inc.*, in the United States District Court for the Western District of Texas Waco Division, Case No. 6:19-cv-261-ADA (W.D. Tex.), Nov. 1, 2019, (47 Pages).

"Exhibit X—U.S. Pat. No. 8,450,165 (Bohr)", *STC.* vs. *Taiwan Semiconductor Manufacturing Company Limited and TSMC North America, Inc.*, in the United States District Court for the Western District of Texas Waco Division, Case No. 6:19-cv-261-ADA (W.D. Tex.), Nov. 1, 2019, (62 Pages).

"Exhibit Y—U.S. Pat. No. 8,685,825 (Tang)", *STC.* vs. *Taiwan Semiconductor Manufacturing Company Limited and TSMC North America, Inc.*, in the United States District Court for the Western District of Texas Waco Division, Case No. 6:19-cv-261-ADA (W.D. Tex.), Nov. 1, 2019, (32 Pages).

"Exhibit Z—US20100270619 (Lee 619)", *STC.* vs. *Taiwan Semiconductor Manufacturing Company Limited and TSMC North America, Inc.*, in the United States District Court for the Western District of Texas Waco Division, Case No. 6:19-cv-261-ADA (W.D. Tex.), Nov. 1, 2019, (48 Pages).

Wang G. et al., "High quality Ge epitaxial layers in narrow channels on Si (001) substrates", Applied Physics Letters, vol. 96, 2010, pp. 111903/1-111903/3.

Baker, "CMOS—Circuit Design, Layout, and Simulation", Revised 2nd Ed., IEEE, 2008.

Goulding, "HAL—The Selective Epitaxial Grown of Silicon", Journal de Physique IV Colluque, 1991.

Hisamoto et al., "FinFET—A Self-Aligned Double-Gate MOSFET Scalable to 20 nm", IEEE Transactions of Electron Devices, vol. 47, No. 12, Dec. 2000, pp. 2320-2325.

Hu "Modern Semiconductor Devices for Integrated Circuits", Prentice Hall, 2010.

Huang et al., "Sub-50nm P-Channel FinFET", IEEE Transactions on Electron Devices, vol. 48, No. 5, May 2001.

Lindert et al., "Quasi-Planar FinFETs with Selectively Grown Germanium Raised Source/Drain" IEE Int'l SOI Conf., Oct. 1, 2001.

Masunaga et al., "A New Way to Achieve Dislocation-free Heteroepitaxial Growth by Molecular Beam Epitaxy: Vertical Microchannel Epitaxy", Journal of Crystal Growth, vols. 237-239, Part 2, Apr. 1, 2002, pp. 1460-1465.

Neamen, "Semiconductor Physics and Devices: Basic Principles", 3rd Ed., McGraw-Hill, 2003.

Nguyen, et al., "Selective epitaxial growth of III-V semiconductor heterostructures on Si substrates for logic application", The Electrochemical Society, Abstract #1952, 2010.

Plummer et al., "Silicon VLSI Technology: Fundamentals, Practice and Modeling", Prentice Hall, 2000.

Sah, "Fundamentals of Solid-State Electronics", World Scientific, 1994.

Streetman, "Solid State Electronic Devices", 4th Ed., Prentice Hall, 1995.

Sze, "VLSI Technology", 2nd Ed., McGraw-Hill, 1988.

Thompson, et al., "A 90-nm Logic Technology Featuring Strained-Silicon", IEEE Trans, on Electron Devices, vol. 51, No. 11, Nov. 2004.

Van Zant et al., "Microchip Fabrication: A Practical Guide to Semiconductor Processing", 2nd Ed., McGraw-Hill, 1990.

Vanamu et al., "Heteroepitaxial Growth on Microscale Patterned Silicon Structures", Journal of Crystal Growth, vol. 280, Jun. 15, 2005.

Verheyen, et al., "25% Drive Current improvement for p-type Multiple Gate FET (MuGFET) Devices by the Introduction of

(56) References Cited

OTHER PUBLICATIONS

Recessed Si0.8Ge0.2 in the Source and Drain Regions", IEEE, Symposium on VLSI Tech. Digest of Tech. Papers, 2005.

Wang et al., "Ge instability and the growth of Ge epitaxial layers in nanochannels on patterned Si (001) substrates", Journal of Applied Physics, vol. 108, No. 12, Dec. 15, 2010.

Zubia, et al., "Nanoheteroepitaxy: The Application of nanostructuring and substrate compliance to the heteroepitaxy of mismatched semiconductor materials", Journal of Applied Physics, vol. 85, No. 9, May 1, 1999.

Intel 22nm tri-gate SAR Chipworks Teardown, May 15, 2012.

Langdo et al., "High quality Ge on Si by epitaxial necking," Applied Physics Letters, vol. 76, Jun. 19, 2000.

Kilchytska et al., "Perspective of FinFETs for analog applications," Proceedings of the 30th European Solid-State Circuits Conference, IEEE Cat No. 04EX850, Print ISBN: 0-7803-8478-4, Sep. 22-23, 2004.

Yagishita, "FinFET SRAM Process Technology for hp32 nm node and beyond," 2007 IEEE International Conference on Integrated Circuit Design and Technology, Print ISBN: 1-4244-0756-7, Sep. 10, 2007.

Kaneko et al., "High-Performance FinFET with Dopant-Segregated Schottky Source/Drain," 2006 International Election Devices Meeting, Print ISSN: 1-4244-0438, Apr. 16, 2007.

Kaneko et al., "Sidewall Transfer Process and Selective Gate Sidewall Spacer Formation Technology for Sub-15nm FinFET with Elevated Source/Drain Extension", IEEE International Electron Devices Meeting, 2005 IEDM Technical Digest, Print ISBN: 0-7803-9268, Apr. 3, 2006.

Liow et al., "Strained N-Channel FinFETs with 25nm Gate Length and Silicon-Carbon Source/Drain Regions for Performance Enhancement", 2006 Symposium on VLSI Technology, 2006 Digest of Technical Papers, Print ISBN: 1-4244-0005-8, Oct. 2, 2006.

Ming, "Strain Engineering for Advanced Transistor Structure", Ph.D. Thesis, National University of Singapore, 2008.

Tan et al., "Novel Extended-Pi Shaped Silicon-Germanium (eπ-SiGe) Source/Drain Stressors for Strain and Performance Enhancement in P-Channel FinFETs", Extended Abstracts of the 2007 International Conference on Solid State Devices and Materials, Japanese Journal of Applied Physics, vol. 47, No. 4S, 2007.

"Intel 22nm Ivy Bridge 3-D Tri-Gate transistor Processors including the corresponding processes and products", Apr. 2012.

Hardy et al. "True green semipolar InGaN-based laser diodes beyond critical thickness limits using limited area epitaxy," Journal of Applied Physics, vol. 114, 2013, 7 pages.

Decision Instituting Inter Partes Review of U.S. Pat. No. 9,142,400 B1, *Globalfoundries Inc.* v. *UNM Rainforest Innovations F/K/A STC.UNM*, United States Patent and Trademark Office Patent Trial and Appeal Board, Case No. IPR2020-00984, Dec. 9, 2020, 68 pages.

Kozlowski et al. "Compliant substrate versus plastic relaxation effects in Ge nanoheteroepitaxy on free-standing Si (001) nanopillars," Appl. Phys. Lett., vol. 99, 2011, 4 pages.

Shamiryan et al. "Dry Etching Process for Bulk FinFET Manufacturing," Microelectronic Engineering, vol. 86, Iss. 1, 2009, pp. 96-98.

Fasarakis et al. "Compact Modeling of Nano-Scale Trapezoidal Cross-Sectional FinFETs," IEEE International Semiconductor Conference Dresden-Grenoble, 2013, pp. 1-4.

Hersee et al., "Nanoheteroepitaxial Growth of GaN on Si Nanopillar Arrays," J. Appl. Phys. vol. 97, Iss. 12, Jun. 2005, pp. 124308-124308-4.

\* cited by examiner

METHOD OF MAKING HETEROEPITAXIAL STRUCTURES AND DEVICE FORMED BY THE METHOD

RELATED APPLICATIONS

This application is a continuation of U.S. patent application Ser. No. 16/162,787, filed Oct. 17, 2018, which is a continuation of U.S. patent application Ser. No. 14/830,241, filed Aug. 19, 2015, now U.S. Pat. No. 10,141,418, which is a divisional of U.S. patent application Ser. No. 13/944,808, filed Jul. 17, 2013, now U.S. Pat. No. 9,142,400, which claims priority under 35 U.S.C. 119 to provisional application No. 61/672,713 filed Jul. 17, 2012, all of which applications are herein incorporated by reference in their entireties.

FEDERALLY SPONSORED RESEARCH

This invention was made with government support under Contract No. EEC-0812056 awarded by the National Science Foundation (NSF) and/or contract No. HDTRA1-11-1-0021 awarded by DTRA. The U.S. Government has certain rights in this invention.

FIELD OF THE DISCLOSURE

The present disclosure is directed to a method for making a heteroepitaxial structure and devices formed by the method.

BACKGROUND

The integrated circuit industry has a long history of "Moore's law" scaling of silicon transistors from dimensions of over 10 microns to today's 22 nm generation. In the current 22 nm generation the industry has moved to a FinFET or tri-gate structure in which the gate is wrapped around three sides of the silicon channel to provide improved electrostatic control of the carriers.

While further scaling is proceeding, the channel in the latest Intel tri-gate transistor is only about 20 atoms wide, so the end to scaling is clearly on the horizon. The industry has identified several directions for continuing the evolution of CMOS circuits. One direction that is being actively investigated is the use of higher mobility materials such as III-V semiconductors, III-N materials and Ge for the transistor channel. Another alternative is the use of vertical transistors with wrap-around (gate all around) geometries, again all of the same material classes are being investigated.

This evolution to heterostructure transistor structures requires new manufacturing approaches. Two principle directions are being investigated: wafer bonding; and heterostructure materials growth. In wafer bonding, the non-silicon materials are grown on their conventional substrates with the inclusion of a separation layer. Following the growth, the epitaxial material is bonded to a silicon wafer and selective etching is used to separate the original substrate. Films of only a few nm thickness have been transferred with this approach. Since the non-silicon material is grown using well established technologies, the issues of lattice mismatch and defects are largely controlled. However, this is a complex technology and is far from manufacturing worthy for the large area silicon substrates (today 300 nm diameter migrating to 450 nm diameter) used by the silicon integrated circuit industry. Thermal expansion mismatch issues (the expansion coefficients of the III-V materials and the Si substrate are different) remain.

Heteroepitaxial growth of different semiconductor and dielectric materials directly on Si(001) is another approach. The main issues are defects associated with the lattice and thermal expansion mismatches between the foreign material and the Si. For large area growths, these issues give rise to dislocations and can cause cracking of the foreign film. Traditionally a thick buffer layer is grown to mitigate these effects and reduce the defects between the substrate and the active layer. While there has been some success with this approach, it is not compatible with integration on the very small scales of today's silicon integrated circuits.

SUMMARY

An embodiment of the present disclosure is directed to a method for making a heteroepitaxial layer. The method comprises providing a semiconductor substrate. A seed area delineated with a selective growth mask is formed on the semiconductor substrate. The seed area comprises a first material and has a linear surface dimension of less than 100 nm. A heteroepitaxial layer is grown on the seed area, the heteroepitaxial layer comprising a second material that is different from the first material.

Another embodiment of the present disclosure is directed to a device. The device comprises a semiconductor substrate and a seed area delineated with a selective growth mask on the semiconductor substrate. The seed area comprises a first material and a linear surface dimension of less than 100. A heteroepitaxial layer is grown on the seed area, the heteroepitaxial layer comprising a second material that is different from the first material.

Another embodiment of the present disclosure is directed to a method for making a heteroepitaxial layer. The method comprises providing a semiconductor substrate. A nanostructured pedestal is formed on the semiconductor substrate, the pedestal having a top surface and a side surface. The top surface forms a seed area having a linear surface dimension that ranges from about 10 nm to about 100 nm. A selective growth mask layer is provided on the top surface and side surface of the pedestal. A portion of the selective growth mask layer is removed to expose the seed area of the pedestal. An epitaxial layer is grown on the seed area.

Still another embodiment of the present disclosure is directed to a heteroepitaxial nanostructure. The heteroepitaxial nanostructure comprises a substrate. A pedestal is formed on the substrate, the pedestal having a top surface and a side surface. The top surface comprises a seed area. A heteroepitaxial layer is grown on the seed area of the pedestal, the seed area having a linear surface dimension that ranges from about 10 nm to about 100 nm.

It is to be understood that both the foregoing general description and the following detailed description are exemplary and explanatory only and are not restrictive of the present teachings, as claimed.

BRIEF DESCRIPTION OF THE DRAWINGS

The accompanying drawing, which is incorporated in and constitutes a part of this specification, illustrates an embodiment of the present teachings and together with the description, serves to explain the principles of the present teachings.

Figure 1A:
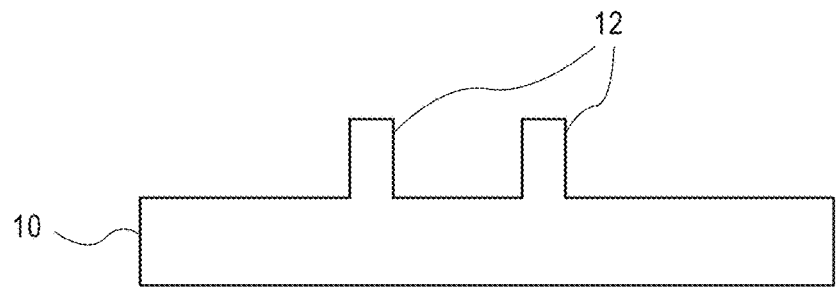
FIGS. 1A-E illustrate a method for making a heteroepitaxial layer, according to an embodiment of the present disclosure.

It should be noted that some details of the figure have been simplified and are drawn to facilitate understanding of the embodiments rather than to maintain strict structural accuracy, detail, and scale.

DESCRIPTION OF THE EMBODIMENTS

Reference will now be made in detail to embodiments of the present teachings, examples of which are illustrated in the accompanying drawing. In the drawings, like reference numerals have been used throughout to designate identical elements. In the following description, reference is made to the accompanying drawing that forms a part thereof, and in which is shown by way of illustration a specific exemplary embodiment in which the present teachings may be practiced. The following description is, therefore, merely exemplary.

The present application is directed to devices and methods for forming devices in which a seed area for heteroepitaxial growth is formed on a semiconductor substrate. The seed area comprises a two-dimensional area with at least one dimension less than about 100 nm. In an embodiment, the seed area comprises a linear surface dimension that ranges from about 10 nm to about 100 nm. In another embodiment, seed areas having heteroepitaxial structures with linear surface dimensions less than 20 or 25 nm can be employed. A heteroepitaxial layer comprising a second material that is different from the first material can be grown using the seed area to nucleate the epitaxial growth. In this application, the term "linear surface dimension" can refer to any linear dimension of the surface of the seed area, such as, for example, a width or diameter.

Employing seed areas having relatively small dimensions in the manner disclosed herein can have one or more of the following benefits: the ability to form heteroepitaxial structures with reduced numbers of defects compared with larger area heteroepitaxial layers; the ability to form heteroepitaxial structures with zero or substantially zero defects; the ability to form heteroepitaxial pillar structures that are flexible and/or that can accommodate strain better than heteroepitaxial layers grown on a planar substrate surface; or the ability to form small area heteroepitaxial films that can accommodate strain better than heteroepitaxial layers grown on a large area of a substrate surface.

The nanoscale heteroepitaxial growth of the present disclosure can exploit the greatly improved materials quality that occurs when the substrate, such as, for example a silicon fin, is nanoscale in lateral size. Thus by using nanoscale heteroepitaxial growth onto, for example, a 10 nm wide silicon area, which is already only ~20 atoms wide, the heteroepitaxial techniques and devices of the present disclosure can take advantage of the evolution of integrated circuits. When the dimensions of a growth area are reduced to below the average scale to nucleate a defect such as a threading dislocation, it is possible to grow heterogeneous materials without nucleating either threading dislocations or antisite defects (boundaries where two grains of the zinc-blende III-V crystal are misoriented by) 180°. The scale for this defect free growth is that at least one linear dimension of the growth area be much less than the mean distance between defects in a large area heteroepitaxial growth. In an embodiment, dimensions of about 100 nm or less can be employed, such as, for example, about 10 to about 20 nm. The table below gives some typical dislocation densities and the corresponding average distance between dislocations. Note that to be suitable for silicon electronics, the incidence of threading dislocations that impact the electrical properties of an individual channel can be exceedingly low. Today's microprocessors contain as many as 3,000,000,000 transistors, and perhaps as many as 30,000,000,000 channels. With continued Moore's law scaling, this number will continue to climb exponentially. The allowed number of defected channels can be a very small fraction of the total number of channels.

| Material/<br>Substrate | Typical Threading<br>Dislocation<br>Density (cm$^{-2}$) | Average Distance between<br>Dislocations (μm) |
|---|---|---|
| Ge$_{0.23}$Si$_{0.77}$/Si(001) | 5 × 10$^5$ | 14 |
| GaAs/Si(001) | 1 × 10$^5$ | 3.2 |
| GaAs/GaAs | 1 × 10$^4$ | 100 |
| InAs/Si(001) | 1 × 10$^7$ | 3.2 |
| GaN/sapphire | 1 × 10$^9$ | 0.32 |
| GaN/SiC | 5 × 10$^8$ | 0.45 |
| GaN/GaN | 1 × 10$^6$ | 10 |
| GaN/Si(111) | 1 × 10$^{10}$ | 0.1 |

The prospects for defect-free nanoscale growth are further improved by the migration of silicon integrated circuits to FinFET architectures. In contrast to the growth in a simple opening atop a bulk substrate, the FinFET pedestal is significantly more compliant, e.g. it can share the strain (lattice displacement) associated with the lattice mismatch stress with the growing film. Control of strain in MOSFET channels is an important aspect of modern integrated circuit manufacturing since the strain directly impacts the electronic properties of the material. Nanoscale growth provides additional approaches to controlling this strain in the FinFET channel by adjusting the dimensions of the "fin" and the thickness and layer structure of the grown material.

FIG. 1A-E illustrate a method for making a heteroepitaxial layer, according to an embodiment of the present disclosure. The method comprises providing a substrate 10. Examples of suitable substrates include silicon wafers, silicon-on-insulator substrates, or other materials used as semiconductor substrates. Suitable substrates are commercially available and are well known in the art. In an embodiment, the semiconductor substrate comprises silicon having a (001) facet exposed for processing. As an example, the cross-sections of substrate 10 shown in the figures herein can have the <110> direction oriented into the paper.

Nanostructured pedestals 12 are formed on the substrate. The Nanostructured pedestals 12 are comprised of any suitable material capable of acting as a seed layer for subsequent epitaxial growth. Examples of suitable materials include doped or undoped single crystal silicon. Other suitable materials include single crystal III-V materials, such as GaAs and GaSb, which are common substrate materials in photonics and high-speed electronics; and single crystal GaN, sapphire and SiC. Any other single crystal material that provides a suitable nucleation surface for the desired epitaxial growth can be employed. In an embodiment, the pedestals 12 can be formed from the same material as the substrate, where the substrate is a single crystal material. In other embodiments, the pedestals can be a different material form the substrate. Any desired technique for forming the single crystal pedestals can be used. Examples of such techniques include various methods for patterning and etching the substrate surface. Suitable techniques are well known in the art. For purposes of strain relief as discussed below, it is useful to have the pedestals roughly as high or higher as the smallest in-plane dimension of the seed area.

Figure 1B:
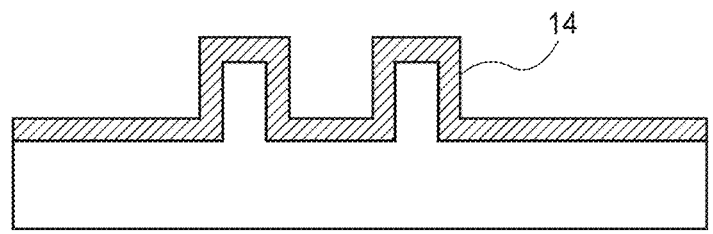

Referring to FIG. 1B, a selective growth mask layer 14 is provided on a top surface and side surface of the pedestal. In an embodiment, the selective growth mask layer 14 can be provided over the entire perimeter of the sidewall surface. In an embodiment, selective growth mask layer 14 is formed on at least three sides of the pedestal, including the top surface and front and back sidewalls of a pedestal. Any suitable technique for forming the selective growth mask layer, such as oxidation of the semiconductor substrate surface, or deposition of material onto the surface, can be employed. Suitable methods for forming selective growth masks are well known in the art.

Figure 1C:
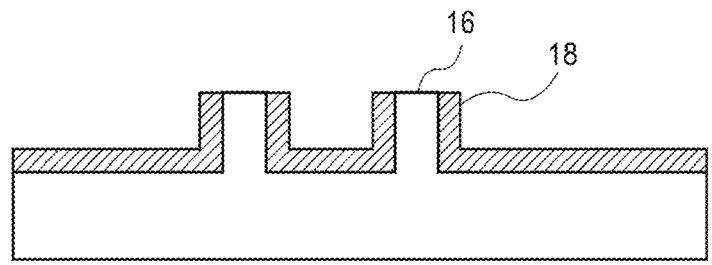

Referring to FIG. 1C, a portion of the selective growth mask layer 14 is removed to expose at least the top surface 16 of the pedestal 12. Various suitable methods can be employed to selectively remove the top portion of selective growth mask layer 14. Examples include anisotropically etching to selectively remove the selective growth mask layer from the top surface of the pedestal; or formation of a non-conformal layer, such as by depositing and reflowing a layer followed by an etch back process. The etch back process can employ polishing, such as chemical mechanical polishing. Yet other examples of techniques for removing a portion of selective growth mask layer 14 will be discussed in greater detail below with respect to the method of FIG. 2.

Figure 1D:
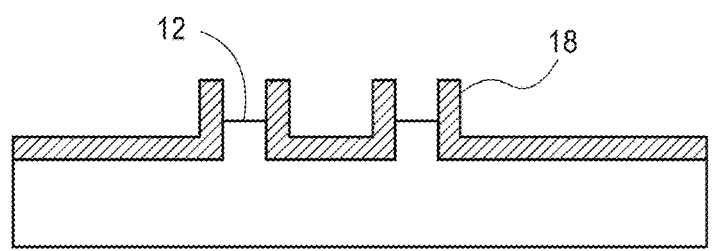

After exposing the top surface of the pedestals 12, the semiconductor material of pedestal 12 can optionally be selectively etched back, as shown in FIG. 1D. As a result of the selective etch back, remaining portions of the selective growth mask layer 14 form sidewall barriers 18. The sidewall barriers 18 can act to block defects, such as stacking faults that propagate, for example, along (111) directions (e.g., at an angle to the top surface).

Any suitable process for selectively etching back the pedestal 12 can be employed. Suitable etch back processes are well known in the art. In an embodiment, the remaining portion of pedestal 12 comprises a (001) facet of silicon material exposed at the pedestal top surface.

Following the selective etch back, an epitaxial layer is grown on the remaining portion of pedestal 12. The exposed top surface of pedestal 12 provides a seed area for the epitaxial growth. As described above, the seed area can have at least one dimension that is less than about 100 nm. Example configurations for the seed area include a rectangular area having with a width dimension ranging from about 10 nm to about 100 nm and a length dimension ranging from about 200 nm to about 2000 nm; or a circular area having a diameter ranging from, for example, about 10 nm to about 100 nm.

In an embodiment, the heteroepitaxial layer comprises a Group III-V semiconductor material. Examples of Group III-V semiconductor materials include nitrogen-based materials, such as gallium nitride or other Group III-N semiconductors, such as AlGaN, indium nitride (InN), and indium gallium nitride ($In_xGa_{1-x}N$). Other examples of Group III-V semiconductor materials include InAs and InAsSb, which have significantly higher electron mobilities and saturation velocities in comparison with Si. The techniques described also apply to semiconductor materials other than III-V materials, such as Ge.

The growth of the epitaxial layer is directed by the seed area of the nanostructured pedestal surface. Epitaxial growth copies the underlying crystal structure of the substrate, e.g., atoms line up as if they are a continuation of the starting crystal structure. In the case of heteroepitaxial growth, the grown film might have the same symmetry as the seed area, but a different natural distance between atoms (this is the lattice mismatch mentioned above).

Figure 1E:
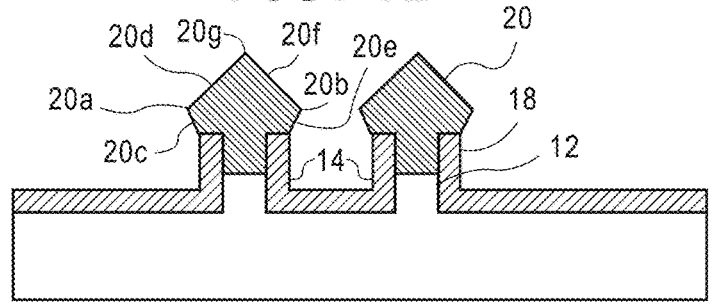

FIG. 1E illustrates an example of a heteroepitaxial nanostructure. The nanostructure comprises the remaining pedestal 12 having a nano-dimensional top surface and a side surface; and the heteroepitaxial layer 20 (sometimes referred to herein as epitaxial layer 20) grown on the nano-dimensional top surface of the pedestal. In an embodiment, the remaining selective growth mask layer 14 extends above the surface of the pedestal 12 to form sidewall barriers 18. The heteroepitaxial layer 20 can grow between and above the sidewall barriers 18, at which point the width dimensions of the heteroepitaxial layer nanostructure may increase to overlap the insulator, as shown, for example, in FIG. 1E. As shown in the example structure of FIG. 1E, a portion of the heteroepitaxial layer 20 above the selective growth mask layer has a polygonal cross-sectional shape having a first lateral vertex 20a and a second lateral vertex 20b opposing the first lateral vertex, a first lower linear surface 20c of the polygonal cross-sectional shape and a first upper linear surface 20d of the polygonal cross-sectional shape meeting at the first lateral vertex 20a, a second lower linear surface 20e of the polygonal cross-sectional shape and a second upper linear surface 20f of the polygonal cross-sectional shape meeting at the second lateral vertex 20b, the first upper linear surface 20d and the second upper linear surface 20f both sloping toward an apex 20g of the heteroepitaxial layer and the first lower linear surface 20c and the second lower linear surface 20e both sloping toward the nanostructured pedestal 12. As indicated by, for example, the use of the term "heteroepitaxial nanostructure" and discussion of "nanoscale heteroepitaxial growth" herein, the distance between the first lateral vertex 20a and the second lateral vertex 20b of the heteroepitaxial layer 20 in the final heteroepitaxial nanostructure can be nano-dimensional. Additional growth can result in further enlargement of the heteroepitaxial layer as desired.

Figure 2A:
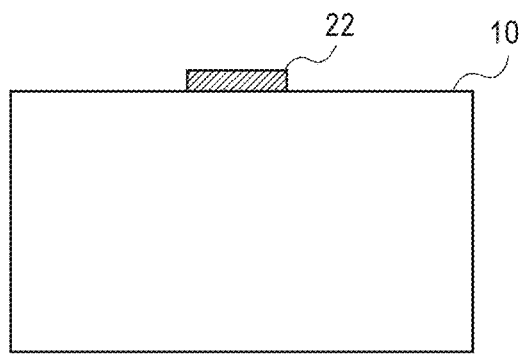
FIGS. 2A-2F illustrate a method for making heteroepitaxial layers, according to another embodiment of the present disclosure.

FIGS. 2A-2F illustrate a method for making heteroepitaxial layers, according to another embodiment of the present disclosure. As illustrated in FIG. 2A, the substrate 10 is a silicon substrate. Pedestals 12 are formed by employing an etch mask 22. The etch mask can have width or diameter dimensions of about 1 micron or less. FIG. 3 illustrates a top view, showing the etch mask 22 used to pattern the substrate. However, any other suitable shaped pattern can be employed, such as masks for forming square or rectangle features. The etch mask 22 can be any suitable mask type, such as a patterned photoresist layer or hard mask formed of, for example, silicon oxide.

Figure 2B:
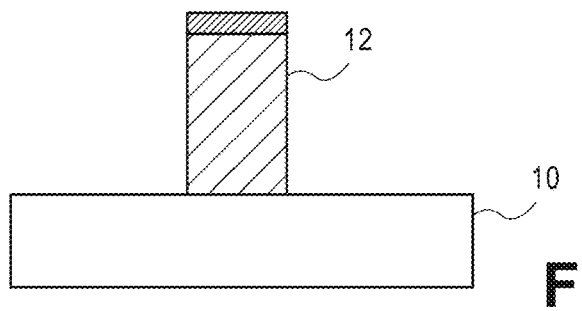
Figure 2C:
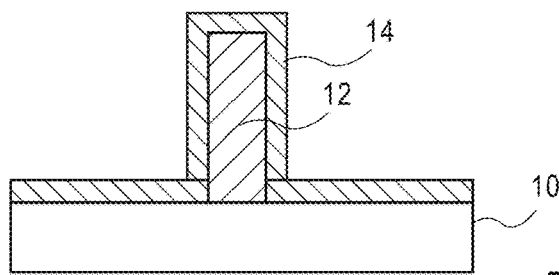
Figure 3:
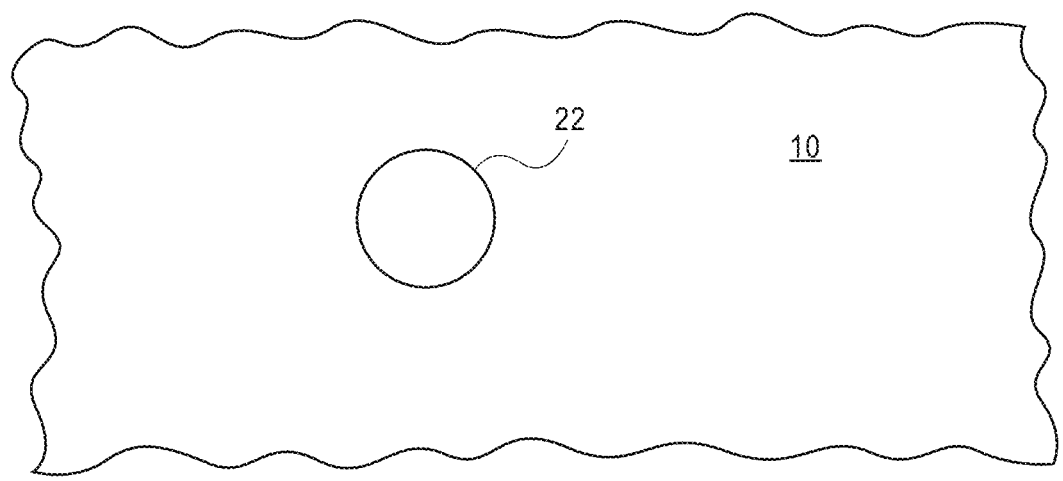
FIG. 3 illustrates a top view of a mask employed in an embodiment of the present disclosure.

Using the etch mask 22, the silicon substrate can be patterned by etching to form the pedestal 12, as illustrated in FIG. 2B. Any suitable etching process can be employed that will form the desired pedestal shape. In an embodiment, a dry etching process is employed.

Following etching, the etch mask 22 can be removed. In an embodiment, thermal oxidation can then be carried out to form a selective growth mask layer 14 of silicon dioxide to a desired thickness. The thermal oxidation process consumes the substrate material, so that the thicker the silicon dioxide layer, the smaller the resulting width dimension of the final pedestal 12. Thus, the thickness of the silicon dioxide can be varied so that the diameter or width of the silicon pedestal 12 is reduced to any desired size dimension. Example width dimensions can be the same as those discussed above for FIG. 1. Alternatively, the pedestal 12 can be patterned to the desired final dimension during the etching step; followed by forming a selective growth mask layer to delineate the seed area by a process that does not consume the silicon to reduce the dimensions of the pedestal 12.

Figure 2D:
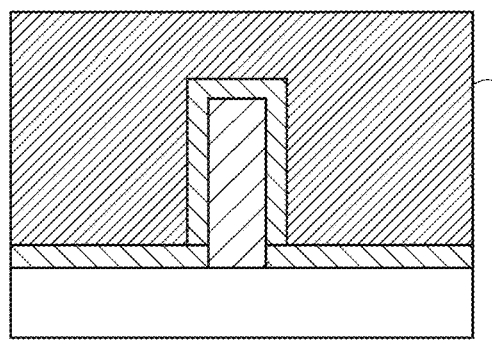

Referring to FIG. 2D, a non-conformal layer 24 is formed over the pedestal 12 and selective growth mask layer 14. Any suitable type of non-conformal layer can be employed. Examples of suitable non-conformal layers include doped silicon oxides, spin-on-glass, photoresist or other materials that can be deposited in liquid form, reflowed, polished or otherwise planarized to reduce surface topography. Suitable non-conformal layers are well known in the art.

Figure 2E:
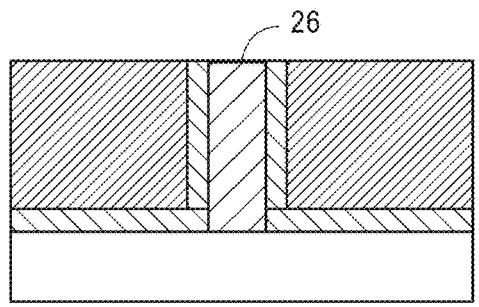

The non-conformal layer can be etched back until the selective growth mask layer 14 at the top of the pedestal 12 is exposed, as illustrated in FIG. 2E. The exposed portion of selective growth mask layer 14 can be removed by the same or a different etch process as is used to etch back the non-conformal layer 24. The remaining portion of the non-conformal layer 24 can then be removed if desired, such as where the non-conformal layer is a polymer.

Once exposed, the pedestal top surface can be used without further processing as a seed area for heteroepitaxial growth, if desired. During epitaxy, a single crystal semiconductor grows on the seed area 26 that is shown exposed in FIG. 2E.

Figure 2F:
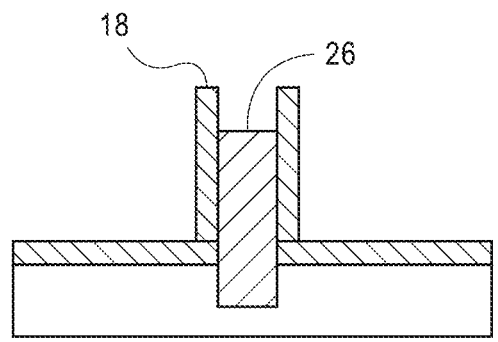
Figure 4:
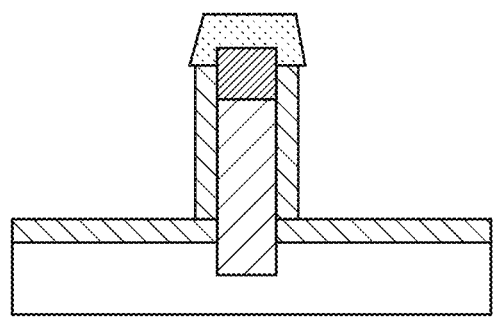
FIG. 4 illustrates a device structure comprising heteroepitaxially grown layers, according to an embodiment of the present disclosure.

Alternatively, a further selective etch back of the seed material of pedestal 12 can be carried out to form the sidewall barriers 18 prior to epitaxial growth, as illustrated in FIG. 2F. The etch back of the seed material can be performed by any suitable selective etch process, such as a dry etching process. Heteroepitaxial growth is then carried out between the sidewall barriers 18. Sidewall barriers 18 can block the propagation of defects, such as stacking faults and misfit dislocations, from the upper region of the heteroepitaxial layer. The resulting structure is shown in FIG. 4, according to an embodiment of the present disclosure.

The epitaxy conditions, such as temperature and the ratio of precursor gases, can be controlled to allow for formation of a planar epitaxial layer surface. For example, a planar GaN(001) facet at the top of GaN epi-layer can be grown using appropriate growth conditions. One of ordinary skill in the art would be able to determine the desired conditions without undue experimentation.

The pedestal structures of the present disclosure can provide one or more of the following benefits: formation of heteroepitaxial materials with reduced defects; the selective growth mask layer 14 can prevent or reduce nucleation at the pedestal sidewalls, thereby isolating the nucleation during epitaxy to the top facet of the pedestal; pedestals can provide increased flexibility and/or the silicon pedestal structure can help relieve strain resulting from the lattice mismatch between the pedestal and the epitaxial material grown thereon.

Figure 5A:
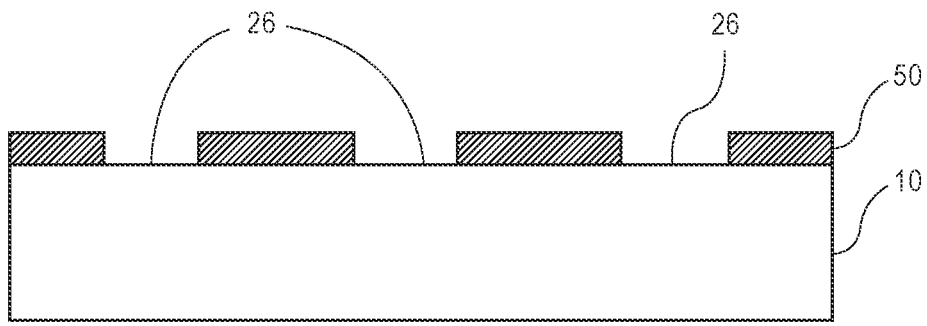
FIGS. 5A-5B illustrate a schematic view of growth mask directly on a 2D substrate surface, according to an embodiment of the present disclosure.
Figure 5B:
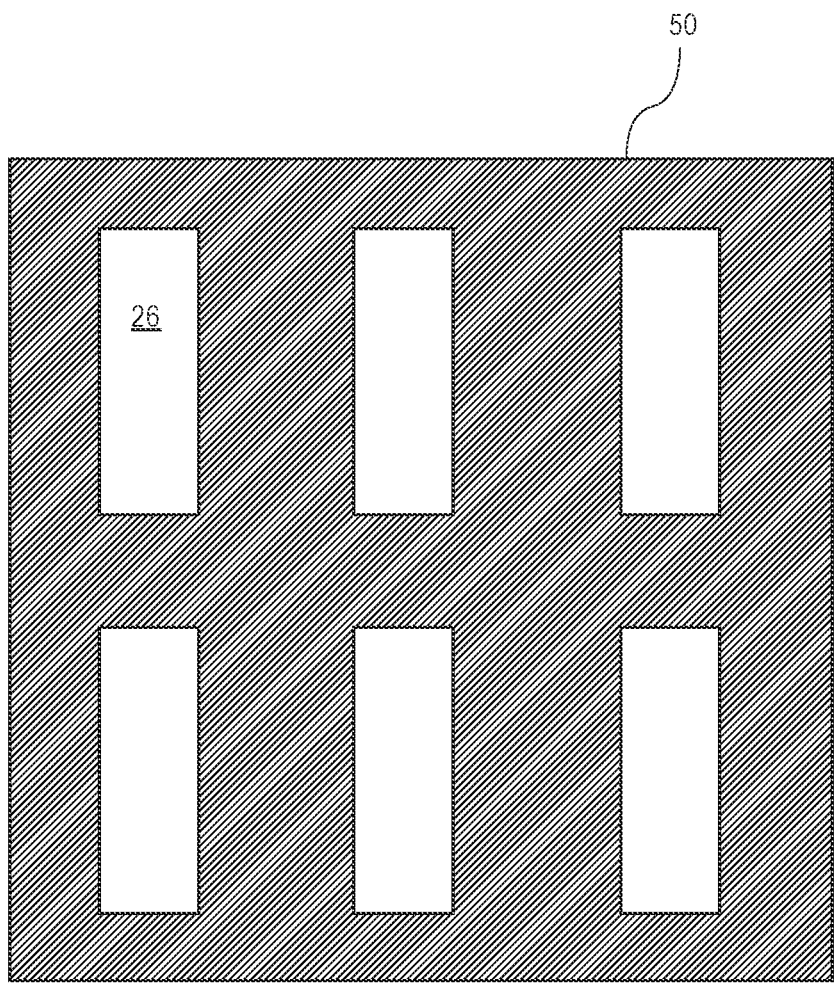

Still other embodiments are contemplated. FIGS. 5A and 5B illustrate a semiconductor substrate 10 comprising a surface masked with any suitable selective growth mask 50 for patterning the seed areas 26. The mask 50 can be relatively thin compared to the thickness of the subsequently formed and fully-grown heteroepitaxial layer that is formed on seed areas 26. A similar embodiment is contemplated that employs a thick growth mask 50 to prevent lateral overgrowth. Again, the term thick is relative to the thickness of the fully-grown heteroepitaxial layer subsequently grown on seed areas 26. Examples of suitable growth masks include $SiO_2$, $Si_3N_4$ or combinations thereof. The dimensions of the seed area can be any of the seed area dimensions described herein. In an embodiment, seed area dimensions in the substrate plane are ~10 nm wide by ~40 nm long. Similar dimensions can be employed for any of the seed areas illustrated in the embodiments of FIGS. 6-9.

Figure 6A:
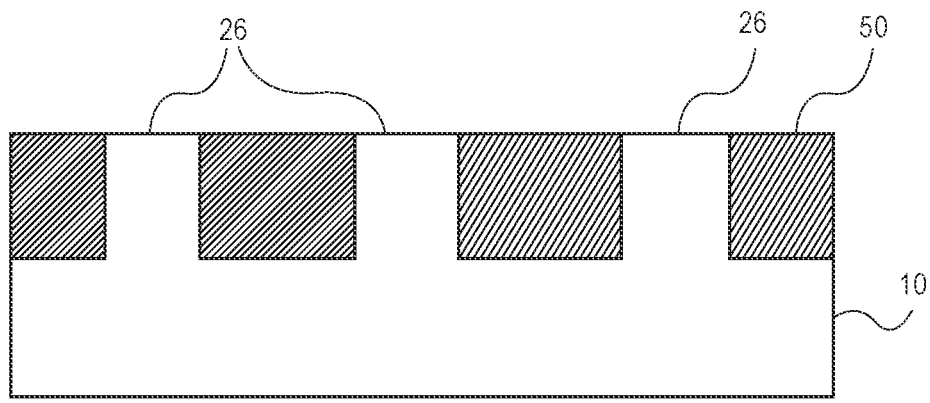
FIGS. 6A-6B illustrate a schematic view of growth mask flush with silicon pedestals, according to an embodiment of the present disclosure.
Figure 6B:
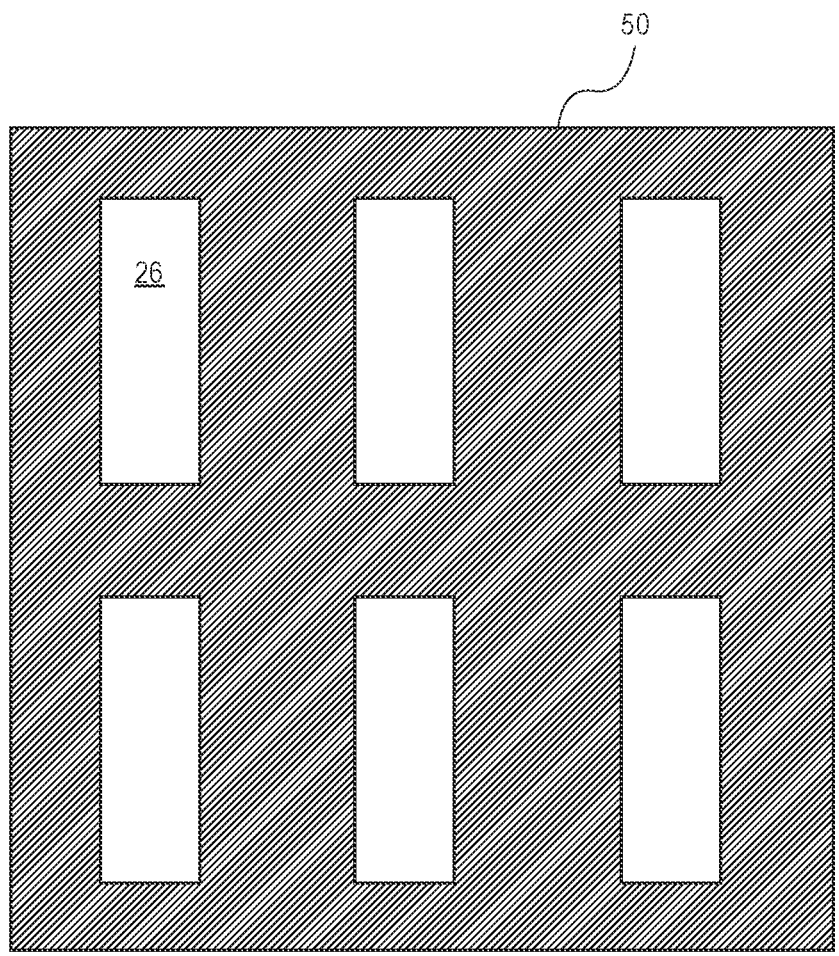

FIGS. 6A and 6B illustrate an embodiment comprising semiconductor pedestals, or plateaus, protruding from the substrate 10 to form the seed areas 26. Mask 50 can be any appropriate growth mask such as $SiO_2$, $Si_3N_4$ or combinations thereof, that is arranged to be more or less flush with the top surface of the seed areas 26.

Figure 7A:
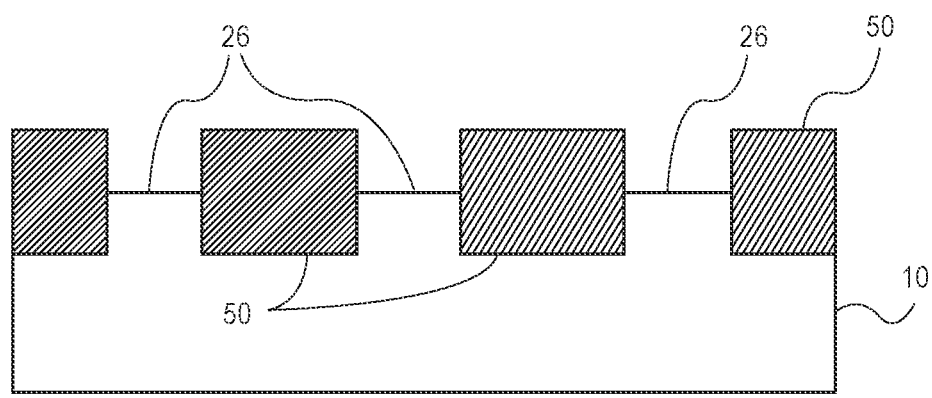
FIGS. 7A-7B illustrate a schematic view of a growth mask extending beyond silicon pedestals, according to an embodiment of the present disclosure.
Figure 7B:
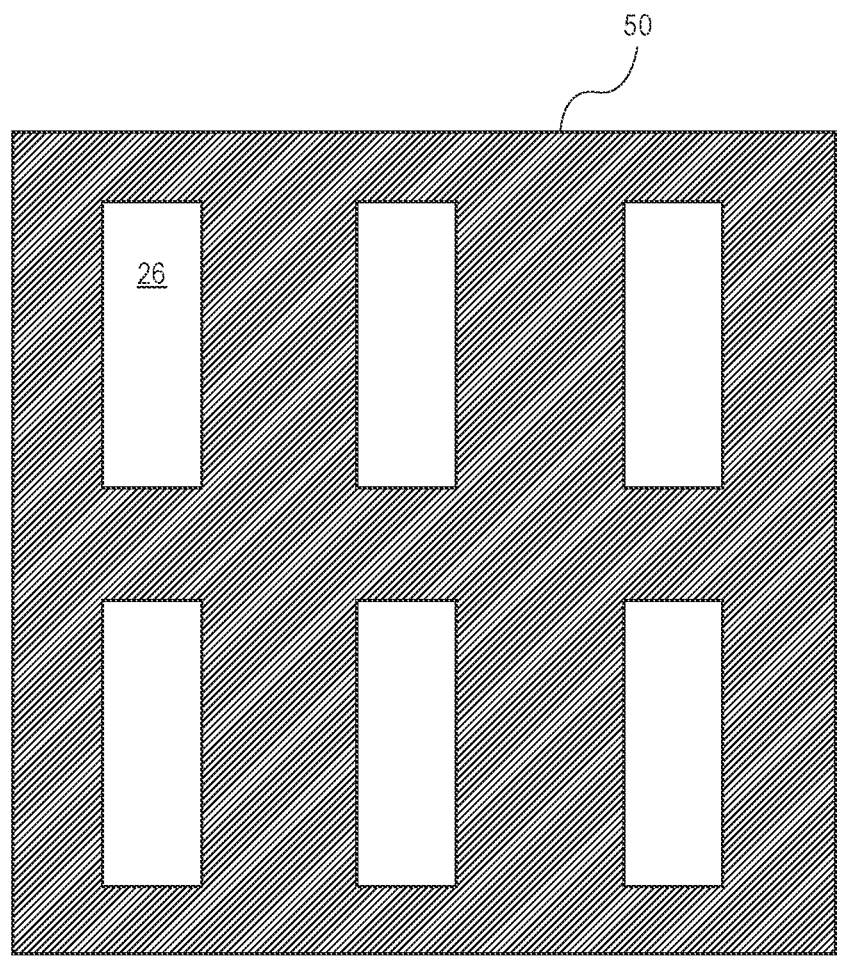

FIGS. 7A and 7B comprise semiconductor pedestals, or plateaus, protruding from the substrate 10 to form the seed areas 26 of the present disclosure, according to an embodiment of the present disclosure. Mask 50 is formed to be higher than the top of seed areas 26.

Figure 8A:
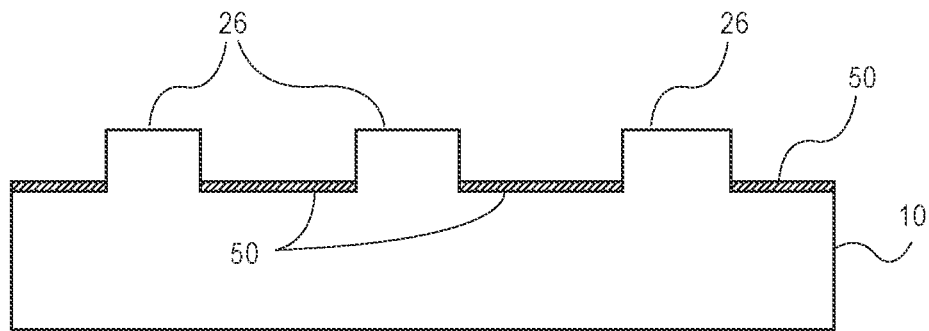
FIGS. 8A-8B illustrate a schematic view of silicon pedestals extending beyond growth mask, according to an embodiment of the present disclosure.
Figure 8B:
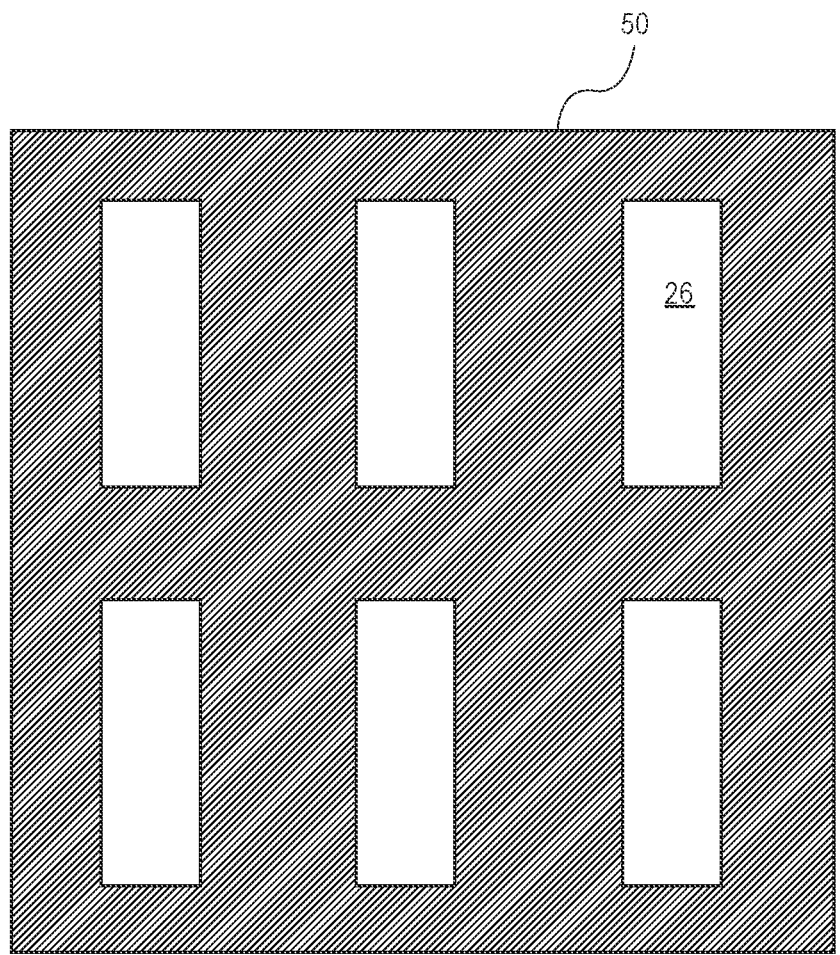
Figure 9A:
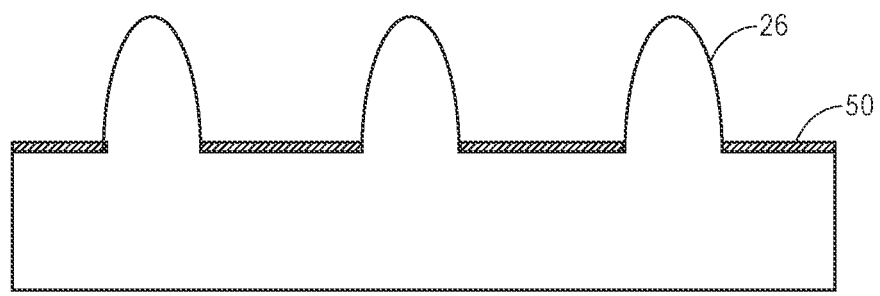
FIGS. 9A-9B illustrate a schematic view of non-faceted silicon pedestals extending beyond growth mask, according to an embodiment of the present disclosure.
Figure 9B:
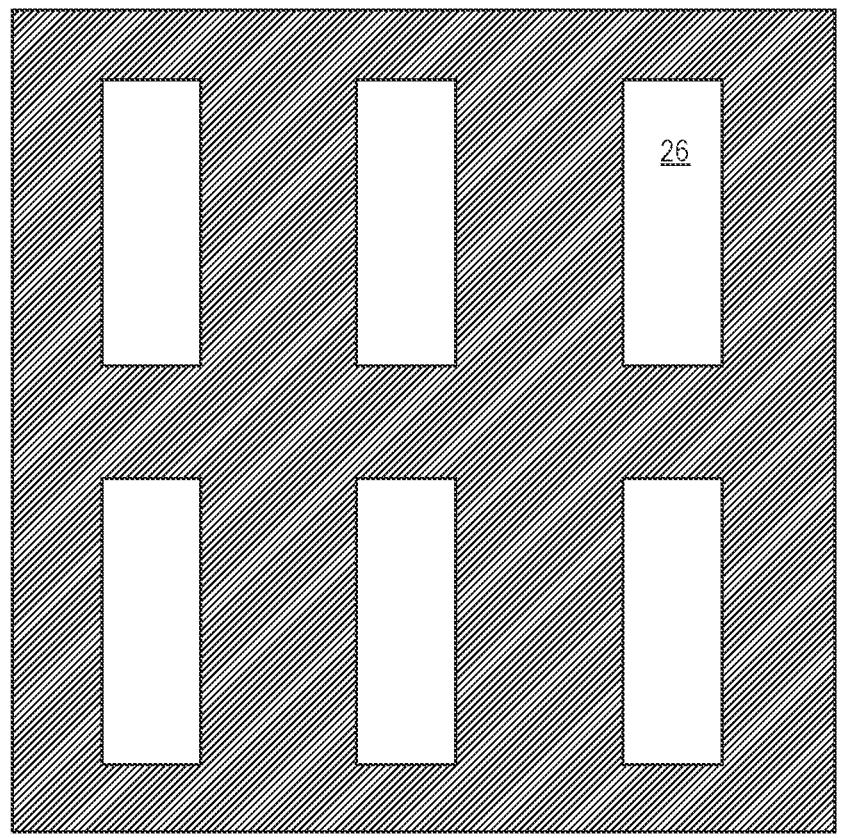

FIGS. 8A and 8B illustrate an alternative embodiment in which the growth mask 50 is lower than the top of seed areas 26, thereby allowing heteroepitaxial growth on the top and sides of the pedestals. FIGS. 9A and 9B illustrate an approach in which non-faceted pedestals protrude from the substrate, according to an embodiment of the present disclosure. The mask 50 can be thinner than the top surface of seed areas 26, thereby allowing growth on the top and sides of the pedestals, similar to the embodiment illustrated in FIG. 8A. In any of the embodiments of FIGS. 5 to 9, the seed areas can comprise any of the semiconductor materials described for seed areas in the present disclosure; and the materials subsequently grown thereon can comprise any of the heteroepitaxial grown semiconductors described herein. Similarly, the mask 50 can be any of the mask materials described herein.

Figure 10:
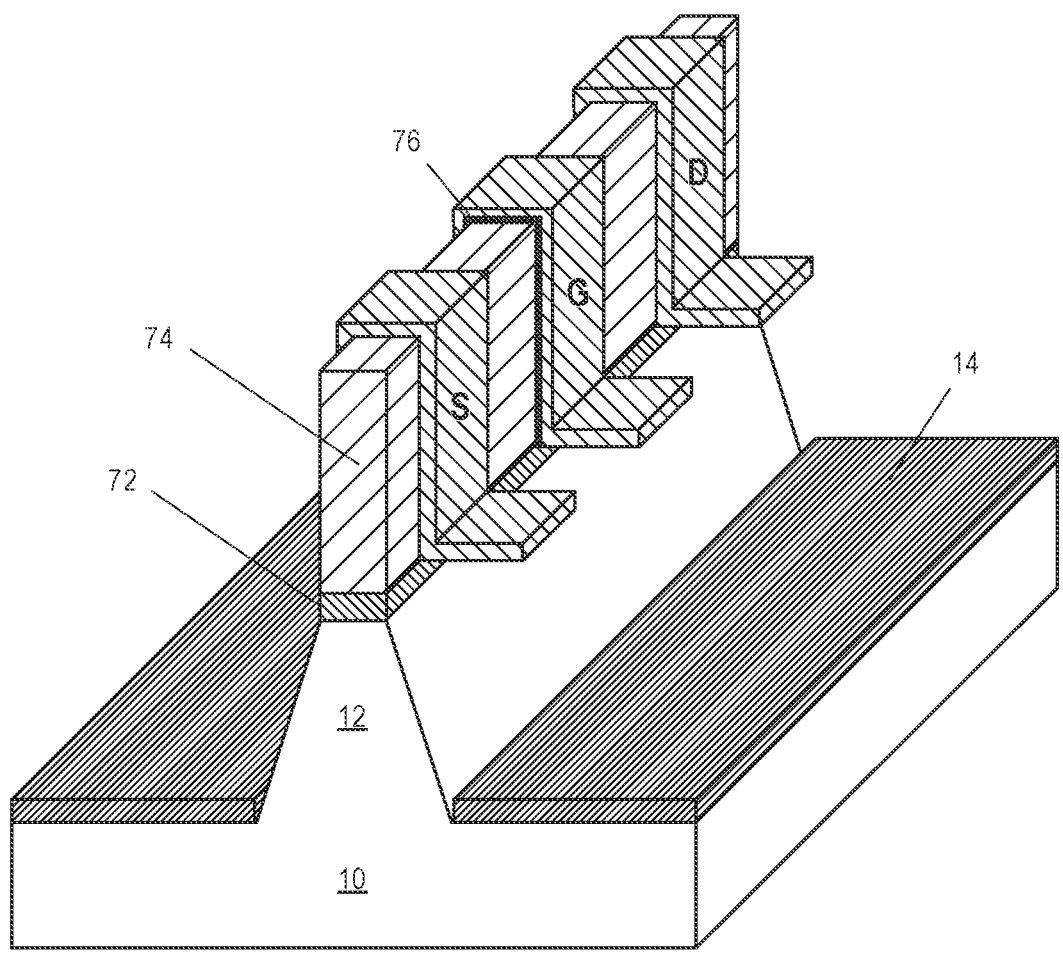
FIG. 10 illustrates an isometric projection of a heterostructure FinFET showing an isolation layer, the source, gate and drain contacts labeled S, G and D respectively, according to an embodiment of the present disclosure.

FIG. 10 illustrates an isometric projection of a FET device 70 that can be formed using heteroepitaxial layer structures, according to an embodiment of the present disclosure.

Pedestal 12 can be formed using any suitable process, such as with a masking layer to prevent growth on the sidewalls of the pedestal. In an embodiment, a growth mask such as that shown in FIG. 7A can be used. The silicon pedestal 12 is shown with sloping sidewalls, but could have any other desired shape.

In an embodiment, heteroepitaxial growth proceeds from the exposed semiconductor surface, or seed area, of pedestal 12. The seed area surface can comprise any suitable material, including any seed area materials discussed herein. In an embodiment, the seed area surface is a Si(001) surface. An isolation layer 72 can be grown on the seed area. Isolation layer 72 can be, for example, a large bandgap material, to prevent leakage of carriers from the channel into the silicon. As noted above, isolation layer 72 can also be a layer, such as an $Al_{0.98}Ga_{0.02}As$ layer, that is easily oxidized following the growth to provide additional isolation. An alternative strategy is to dope the silicon so that it forms a p-n junction with the channel material, also reducing leakage of carriers into the silicon. Depending on the details of the bandgap alignment between the channel material and the silicon, isolation layer 72 may or may not be necessary.

In an embodiment, it is possible to grow a layer, such as but not restricted to, a high Al concentration AlGaAs layer, which can be selectively oxidized during the device processing subsequent to growth of the heteroepitaxial layer. This allows epitaxial growth while at the same time providing the advantages of a semiconductor-on-oxide structure where the carriers are strongly confined to the channel. Additionally, the aluminum oxide layer can be selectively removed to provide access for a gate-all-around configuration. Examples of this technique are described in U.S. Provisional Patent Application 61/752,741, entitled Gate-All-Around Metal-Oxide-Semiconductor Transistors with Gate Oxides, filed Jan. 15, 2013, the disclosure of which is hereby incorporated herein by reference in its entirety.

Following the growth of the optional isolation layer, a channel layer 74 is grown. Channel layer 74 is a heteroepitaxial layer and can comprise any suitable materials discussed herein for heteroepitaxial growth. In an embodiment, the bandgap engineering that is common in III-V devices can be used in devices of the present disclosure to, for example, grow higher bandgap cladding layers below and above the active channel layer. This can shield the carriers in the channel from surface defects and reduces scattering and improves carrier mobilities, saturation velocities, and lifetimes.

In an embodiment, channel layer 74 can comprise several layers. For example, channel layer 74 can comprise a GaAs/InGaAs/GaAs structure in which the high mobility InGaAs material is clad with upper and lower high bandgap materials to shield the carriers from the higher point defect densities at the interface with the pedestal 12 or isolation layer and at the top surface of the growth.

Figure 12:
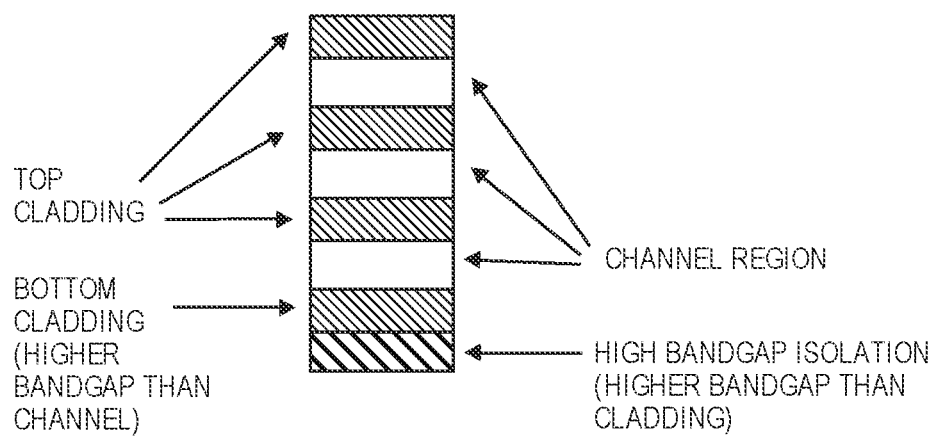
FIG. 12 illustrates a layered heterostructure for channel region of a device, according to an embodiment of the present disclosure.

FIG. 12 shows a possible layered heterostructure sequence for the channel layer 74, according to an embodiment of the present disclosure. This structure takes advantage of bandgap engineering that is well known for III-V devices. The structure comprises a bottom large bandgap material in contact with a pedestal 12. A bottom cladding functions to keep carriers away from the interface with pedestal 12. A channel region and a top cladding are formed over the bottom cladding. As is well known in the art, the channel region and top cladding can optionally be repeated a number of times, as shown, to provide increased current carrying capacity if thin channel regions, such as quantum wells, are desired.

Following the heteroepitaxial growth step of channel layer 74, doping of the source and drain regions can be carried out. This can include a masked ion implantation followed by an annealing step to activate the impurities. This will modify the growth layers by impurity induced diffusion to lower the resistance of the source-gate-drain transitions. A gate dielectric 76 and source "S", drain "D" and gate "G" electrodes, as illustrated in FIG. 10, can be formed by any suitable methods. Suitable methods are known in the art.

Figure 11:
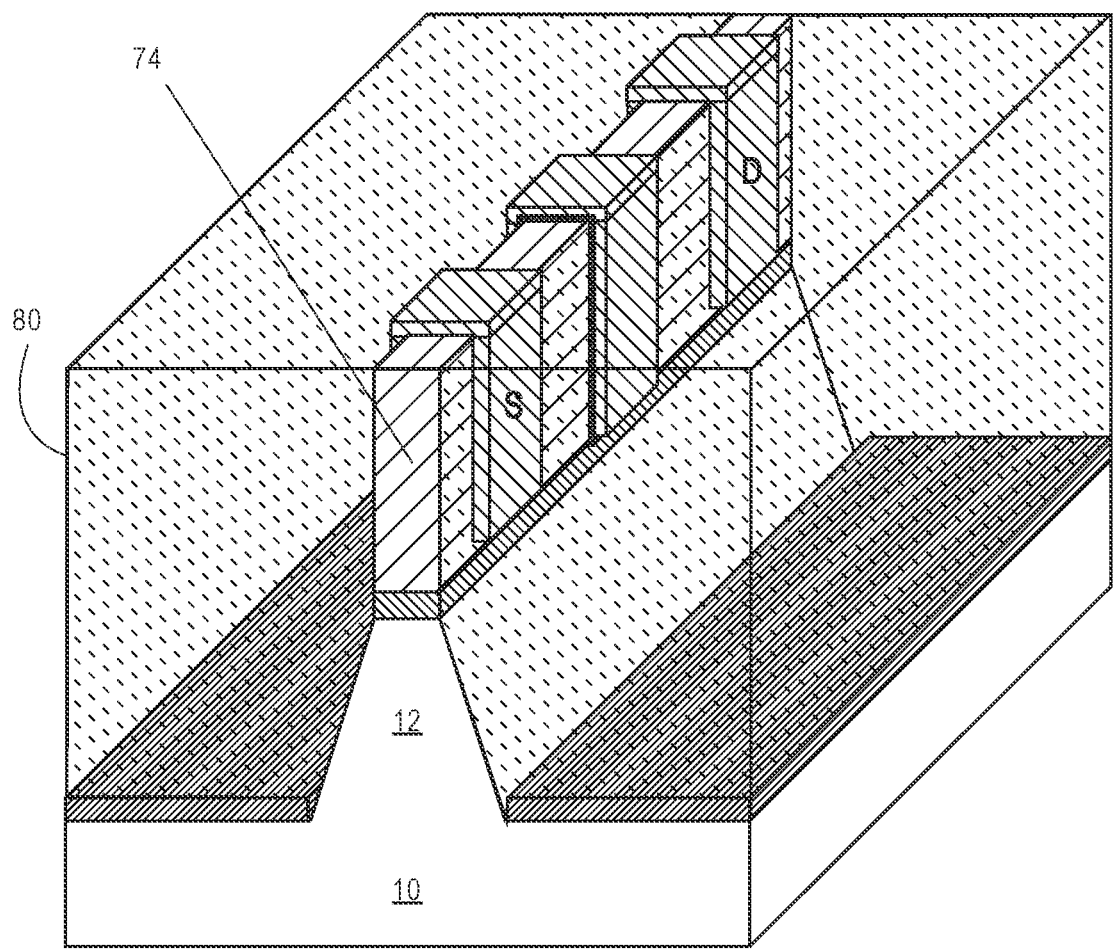
FIG. 11 illustrates an isometric projection of a heterstructure FinFET with a dielectric isolation (shown as semitransparent for clarity), according to an embodiment of the present disclosure.

FIG. 11 shows an embodiment where a dielectric spacer 80 is used to planarize the structure following the S/G/D metallization. This layer can be thicker than the finFET and contact holes can be created for contacting the S/G/D, as is well known in the art.

Another geometry of interest is a vertical channel. This embodiment lends itself to a gate all around configuration and has the significant advantage that the gate is self-aligned to the nanowires. The gate length can be set by deposition processes which are much more controllable than lithography at nm dimensions. Examples of vertical MOSFETS are described in U.S. Pat. No. 8,344,361, the disclosure of which is hereby incorporated by reference in its entirety. The '361 patent does not explicitly discuss heterostructure growth from a silicon substrate, and is primarily about forming two and three terminal devices.

Figure 13:
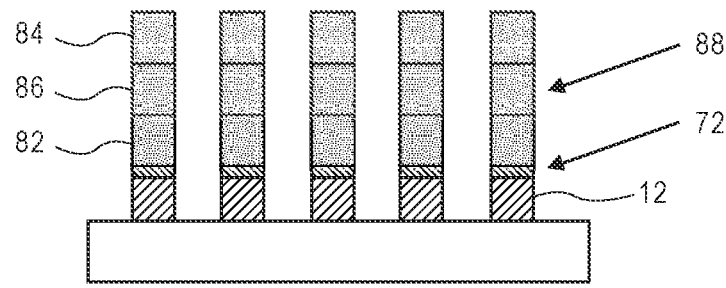
FIGS. 13-14 illustrate schematic views of vertical nanowire transistors grown seed areas, according to an embodiment of the present disclosure.
Figure 14:
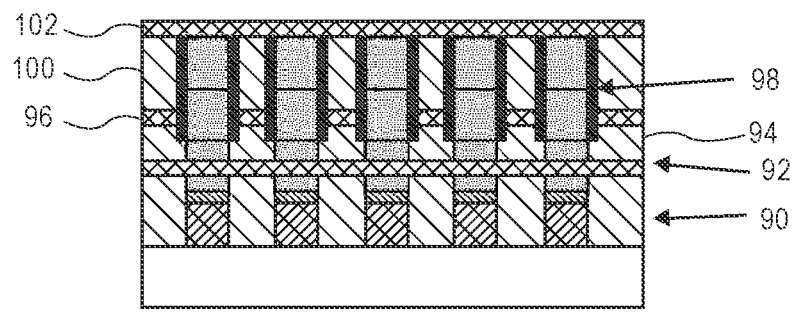

FIGS. 13 and 14 illustrate a process for forming high mobility channel vertical transistors based on nanowire growth from nanoscale Si seeds. The seed area can have a linear surface dimension of 100 nm or less, such as 20 or 25 nm or less, or about 10 nm. For specificity, the concept proceeds in a source down configuration. However, the alternative drain down configuration is also available, as would be understood by one of ordinary skill in the art.

As shown, the heteroepitaxial growth starts from Si(001) pedestals 12 that can have any desired shape, such as square or round cross-sections, or extended into walls (e.g., a length dimension that is many times larger than the width dimension, such as 5, 10 or 100 times or more). An optional isolation layer 72 is first grown to isolate the source from the Si material. Since the source region 82 is adjacent to the silicon in a source down embodiment, and a good contact can be provided, leakage into the silicon is not as important to the device performance as it was for the horizontal devices where the gate region was in direct contact with the silicon substrate material. Doping can be varied during the epitaxial growth to provide heavy doping in the source and drain regions 82, 84 and reduced doping in the gate region 86.

The de-lineation of the source/gate/drain regions of the nanowires refers to doping levels during the growth. The vertical devices are shown in parallel, e.g. all source, gate and drain contacts are connected to the same metallization. In an actual circuit, only some of the devices will be connected in parallel to provide current carrying capability; other devices would form the channels of different transistors in accordance with the circuit design.

Following the growth of the nanowire 88, a dielectric layer 90 is provided to isolate the silicon followed by formation of the source contact layer 92. Appropriate annealing processes can be employed to assure good contact to the source regions of the nanowires. While all of the sources are shown connected in parallel; in practice, one or more of the nanowires will be in parallel to provide current carrying capability and others will be incorporated into different transistors as dictated by the circuit design.

Following formation of the source contact 92, a field dielectric layer 94 can be deposited to isolate the gate contact 96 from the source contact 92. Initially, the field dielectric layer 94 can stop just short of the gate region to allow for oxidation of the nanowire to provide the gate dielectric 98. The field dielectric 94 can then be continued to the middle of the gate region and gate contact 96 is provided.

Following formation of gate contact 96, additional field dielectric 100 can be deposited on top of the gate contact to completely cover the nanowires 88. Then an etch back step can be carried out to expose the top of the drain regions and a drain contact 102 is provided. Additional processing can be used to define the various transistors and interconnections, as is the case in traditional integrated circuit manufacturing. There can be many variants on this basic process. For example, the gate oxide layer can be removed from the sidewall of the drain region and contact made using this sidewall in place of the top contact shown.

Using methods of the present disclosure, growth of the channels and the source and drain regions of transistor structures can be carried out simultaneously. An advantage is that the transitions between the source, channel and drain regions are single crystal material thereby providing high-quality, low-resistance transitions. Threading dislocations in the source/drain regions are relatively benign since these are less critical heavily doped regions, where the electrical impact of the dislocation is reduced by screen associate with the high concentration of carriers. This is true for both horizontal and vertical geometries.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein.

While the present teachings have been illustrated with respect to one or more implementations, alterations and/or modifications can be made to the illustrated examples without departing from the spirit and scope of the appended claims. In addition, while a particular feature of the present teachings may have been disclosed with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." Further, in the discussion and claims herein, the term "about" indicates that the value listed may be somewhat altered, as long as the alteration does not result in nonconformance of the process or structure to the illustrated embodiment. Finally, "exemplary" indicates the description is used as an example, rather than implying that it is an ideal.

Other embodiments of the present teachings will be apparent to those skilled in the art from consideration of the specification and practice of the present teachings disclosed herein. It is intended that the specification and examples be considered as exemplary only, with a true scope and spirit of the present teachings being indicated by the following claims.

What is claimed is:

1. A method for making a heteroepitaxial layer, the method comprising:
   providing a semiconductor substrate;
   forming a nanostructured pedestal on the semiconductor substrate, the pedestal having a top surface and a side surface;
   providing a selective growth mask layer on the top surface and side surface of the pedestal;
   removing a portion of the selective growth mask layer to expose the pedestal and form a seed area, the seed area having a linear surface dimension that ranges from about 10 nm to about 25 nm, the seed area comprising a (001) plane of silicon, and the seed area is not recessed from a top of the selective growth mask; and
   growing a heteroepitaxial layer on the seed area without nucleating substantially any threading dislocations, wherein the heteroepitaxial layer is substantially unrestricted by sidewalls during growth and wherein a portion of the heteroepitaxial layer above the selective growth mask layer has a polygonal cross-sectional shape having a first lateral vertex and a second lateral vertex opposing the first lateral vertex, a first lower linear surface of the polygonal cross-sectional shape and a first upper linear surface of the polygonal cross-sectional shape meeting at the first lateral vertex, a second lower linear surface of the polygonal cross-sectional shape and a second upper linear surface of the polygonal cross-sectional shape meeting at the second lateral vertex, the first upper linear surface and the second upper linear surface both sloping toward an apex of the heteroepitaxial layer and the first lower linear surface and the second lower linear surface both sloping toward the nanostructured pedestal.

2. The method of claim 1, wherein the seed area is substantially level with the selective growth mask layer.

3. The method of claim 1, wherein the heteroepitaxial layer is a discrete nanostructure.

4. The method of claim 1, wherein the top surface of the pedestal forms a seed area that is approximately coplanar with a top surface of the selective growth mask layer.

5. The method of claim 1, wherein the heteroepitaxial layer is substantially defect-free.

6. The method of claim 1, wherein an interface between the heteroepitaxial layer and the seed area is substantially defect-free.

7. The method of claim 1, wherein the entire heteroepitaxial layer is above a top surface of the selective growth mask layer.

8. The method of claim 1, wherein the semiconductor substrate comprises silicon having a [001] direction normal to a substrate surface.

9. The method of claim 1, wherein the heteroepitaxial layer forms a portion of a transistor.

10. A method for making a heteroepitaxial layer, the method comprising:
    providing a semiconductor substrate;
    forming a nanostructured pedestal on the semiconductor substrate, the pedestal having a top surface and a side surface;
    providing a selective growth mask layer on the top surface and side surface of the pedestal;
    removing a portion of the selective growth mask layer to expose the pedestal and form a seed area, the seed area having a linear surface dimension that ranges from about 10 nm to about 25 nm, the seed area comprising a (001) plane of silicon, the seed area being substantially level with the selective growth mask layer; and
    growing a heteroepitaxial layer on the seed area without nucleating substantially any threading dislocations, wherein a portion of the heteroepitaxial layer above the selective growth mask layer has a polygonal cross-sectional shape having a first lateral vertex and a second lateral vertex opposing the first lateral vertex, a first lower linear surface of the polygonal cross-sectional shape and a first upper linear surface of the polygonal cross-sectional shape meeting at the first lateral vertex, a second lower linear surface of the polygonal cross-sectional shape and a second upper linear surface of the polygonal cross-sectional shape meeting at the second lateral vertex, the first upper linear surface and the second upper linear surface both sloping toward an apex of the heteroepitaxial layer and the first lower linear surface and the second lower linear surface both sloping toward the nanostructured pedestal.

11. The method of claim 10, wherein the heteroepitaxial layer is substantially unrestricted by sidewalls during growth.

12. The method of claim 10, wherein the heteroepitaxial layer is substantially defect-free.

13. The method of claim 10, wherein an interface between the heteroepitaxial layer and the seed area is substantially defect-free.

14. The method of claim 10, wherein the entire heteroepitaxial layer is above a top surface of the selective growth mask layer.

15. The method of claim 10, wherein the semiconductor substrate comprises silicon having a [001] direction normal to a substrate surface.

16. The method of claim 10, wherein the heteroepitaxial layer forms a portion of a transistor.

17. A method for making a heteroepitaxial layer, the method comprising:
providing a semiconductor substrate;
forming a nanostructured pedestal on the semiconductor substrate, the pedestal having a top surface and a side surface;
providing a selective growth mask layer on the top surface and side surface of the pedestal;
removing a portion of the selective growth mask layer to expose the pedestal and form a seed area, the seed area having a linear surface dimension that ranges from about 10 nm to about 25 nm, the seed area comprising a (001) plane of silicon, the seed area being approximately coplanar with a top surface of the selective growth mask layer; and
growing a heteroepitaxial layer on the seed area without nucleating substantially any threading dislocations, wherein the heteroepitaxial layer grows wider than the seed area, a portion of the heteroepitaxial layer above the selective growth mask layer having a polygonal cross-section having a first lateral vertex and a second lateral vertex opposing the first lateral vertex, a first lower linear surface of the polygonal cross-sectional shape and a first upper linear surface of the polygonal cross-sectional shape meeting at the first lateral vertex, a second lower linear surface of the polygonal cross-sectional shape and a second upper linear surface of the polygonal cross-sectional shape meeting at the second lateral vertex, the first upper linear surface and the second upper linear surface both sloping toward an apex of the heteroepitaxial layer and the first lower linear surface and the second lower linear surface both sloping toward the nanostructured pedestal.

18. The method of claim 17, wherein the heteroepitaxial layer is substantially unrestricted by sidewalls during growth.

19. The method of claim 17, wherein the entire heteroepitaxial layer is above a top surface of the selective growth mask layer.

20. The method of claim 17, wherein the heteroepitaxial layer is a discrete nanostructure.

21. The method of claim 10, wherein the heteroepitaxial layer is a discrete nanostructure.

22. The method of claim 1, wherein the heteroepitaxial layer comprises a Group III-V semiconductor material.

23. The method of claim 22, wherein the Group III-V semiconductor material comprises a material chosen from Group III-N semiconductors, InAs and InAsSb.

24. The method of claim 22, wherein the Group III-V semiconductor material is a Group III-N semiconductor, the Group III-N semiconductor comprising a material chosen from gallium nitride, AlGaN, indium nitride (InN) and indium gallium nitride ($In_xGa_{1-x}N$).

25. The method of claim 1, wherein the heteroepitaxial layer comprises Ge.

* * * * *